United States Patent
Ko et al.

(10) Patent No.: US 12,414,353 B2
(45) Date of Patent: Sep. 9, 2025

(54) METHOD FOR FORMING SEMICONDUCTOR STRUCTURE

(71) Applicant: TAIWAN SEMICONDUCTOR MANUFACTURING COMPANY, LTD., Hsinchu (TW)

(72) Inventors: Chung-Ting Ko, Kaohsiung (TW); Wen-Ju Chen, New Taipei (TW); Tai-Chun Huang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/768,561

(22) Filed: Jul. 10, 2024

(65) Prior Publication Data
US 2024/0363436 A1 Oct. 31, 2024

Related U.S. Application Data

(63) Continuation of application No. 17/237,249, filed on Apr. 22, 2021, now Pat. No. 12,087,641.

(51) Int. Cl.
*H10D 84/01* (2025.01)
*H01L 21/02* (2006.01)
(Continued)

(52) U.S. Cl.
CPC ....... *H10D 84/017* (2025.01); *H01L 21/0259* (2013.01); *H01L 21/30604* (2013.01);
(Continued)

(58) Field of Classification Search
CPC .............. H10D 84/017; H10D 30/031; H10D 30/6713; H10D 30/6735; H10D 30/6757;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 111261586 A * 6/2020 ......... B81C 1/00007

OTHER PUBLICATIONS

English translation of CN 111261586-A (Year: 2020).*
IP.com npl search (Year: 2024).

*Primary Examiner* — William B Partridge
*Assistant Examiner* — David Paul Sedorook
(74) *Attorney, Agent, or Firm* — Birch, Stewart, Kolasch & Birch, LLP

(57) ABSTRACT

A method for forming a semiconductor structure is provided. The method includes forming a first active region and a second active region, etching the first active region and the second active region to form a first recess and a second recess, respectively, forming the first dielectric layer over the first active region and the second active region, forming a first fill layer over the first dielectric layer to overfill the first recess and the second recess, forming a first dielectric mask over the first fill layer, etching first portions of the first dielectric mask and the first fill layer over the first active region, removing a first portion of the first dielectric layer over the first active region, and forming a first source/drain feature on the first active region.

20 Claims, 35 Drawing Sheets

(51) Int. Cl.
*H01L 21/306* (2006.01)
*H01L 21/308* (2006.01)
*H10D 30/01* (2025.01)
*H10D 30/67* (2025.01)
*H10D 62/00* (2025.01)
*H10D 62/10* (2025.01)
*H10D 64/01* (2025.01)
*H10D 84/03* (2025.01)
*H10D 84/85* (2025.01)

(52) U.S. Cl.
CPC ....... *H01L 21/3081* (2013.01); *H10D 30/031* (2025.01); *H10D 30/6713* (2025.01); *H10D 30/6735* (2025.01); *H10D 30/6757* (2025.01); *H10D 62/021* (2025.01); *H10D 62/118* (2025.01); *H10D 64/017* (2025.01); *H10D 64/018* (2025.01); *H10D 84/0167* (2025.01); *H10D 84/0172* (2025.01); *H10D 84/0184* (2025.01); *H10D 84/038* (2025.01); *H10D 84/85* (2025.01)

(58) Field of Classification Search
CPC .. H10D 62/021; H10D 62/118; H10D 64/017; H10D 64/018; H10D 84/0167; H10D 84/0172; H10D 84/0184; H10D 84/038; H10D 84/85; H10D 30/797; H10D 30/014; H10D 62/822; H10D 64/021; H10D 62/121; H10D 30/43; H10D 84/0193; H10D 84/0128; H10D 84/0158; H10D 84/013; B82Y 10/00; H01L 21/0259; H01L 21/3081; H01L 21/31144; H01L 21/31111
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2013/0295756 | A1* | 11/2013 | Yuan ..................... H01L 23/485 438/597 |
| 2015/0079740 | A1* | 3/2015 | Kim ..................... H10D 84/017 438/589 |
| 2019/0326288 | A1 | 10/2019 | Hashemi et al. |
| 2019/0355723 | A1* | 11/2019 | Miao ..................... H10D 62/121 |
| 2020/0020782 | A1 | 1/2020 | Ching et al. |
| 2020/0051869 | A1* | 2/2020 | Chiang ..................... H01L 29/401 |
| 2020/0135729 | A1 | 4/2020 | Ng et al. |
| 2020/0295200 | A1* | 9/2020 | Xie ..................... H10D 30/6755 |
| 2020/0343377 | A1* | 10/2020 | Chiang ............. H01L 29/78696 |
| 2020/0373159 | A1 | 11/2020 | Koshizawa et al. |
| 2021/0183855 | A1 | 6/2021 | Ng et al. |
| 2021/0226020 | A1 | 7/2021 | Lin et al. |
| 2021/0234017 | A1 | 7/2021 | Yao et al. |

* cited by examiner

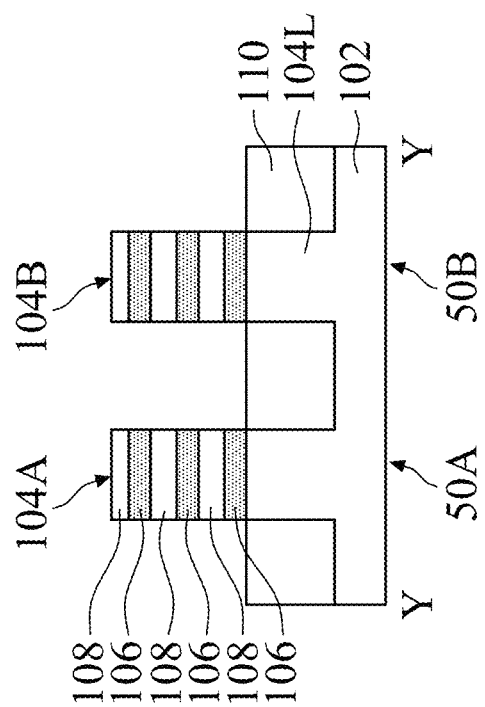
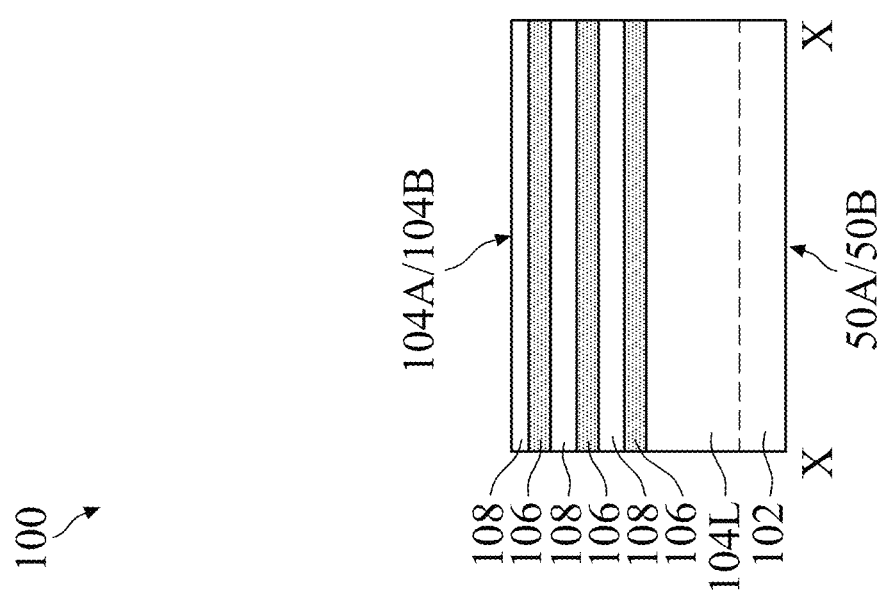

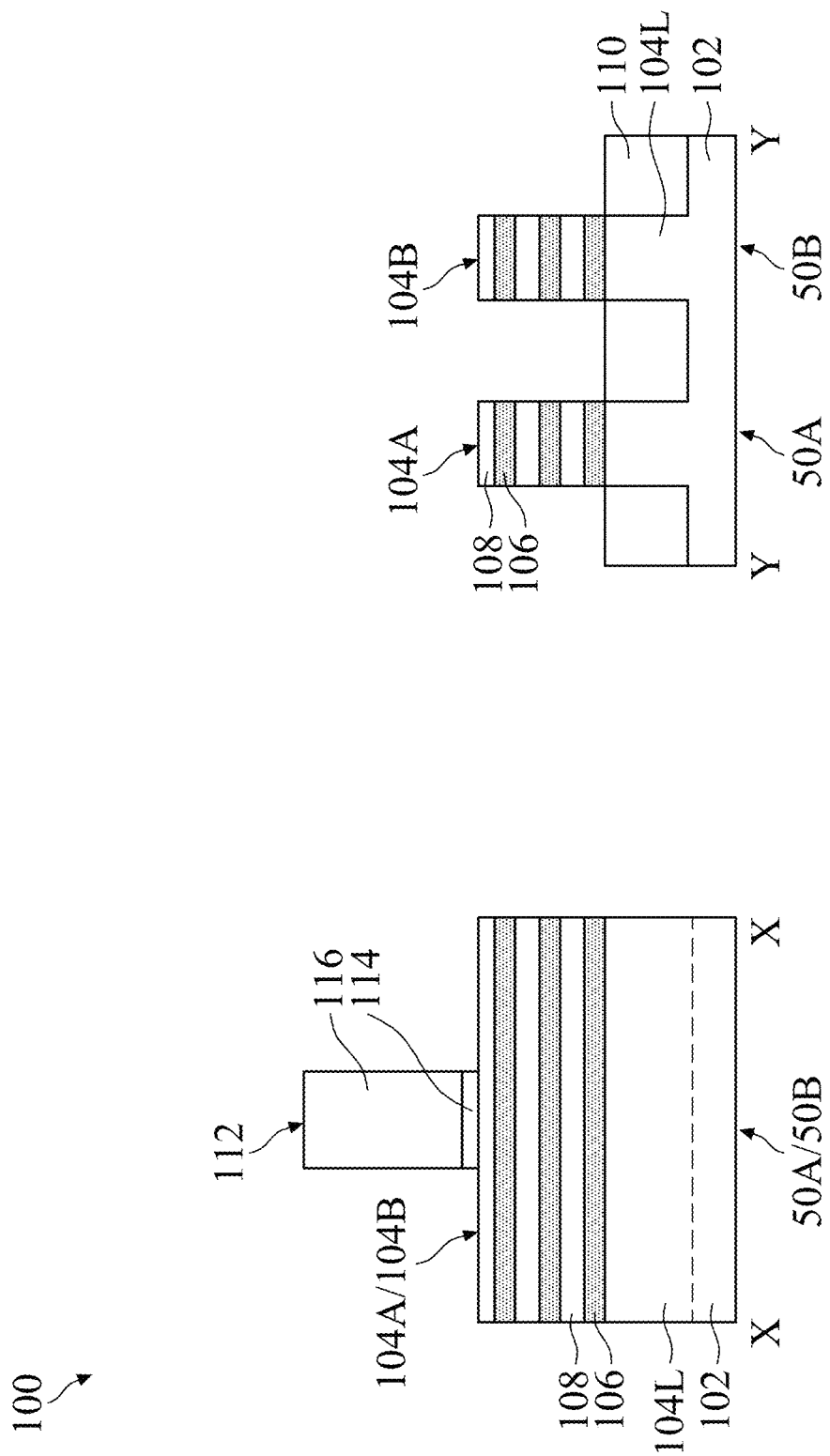

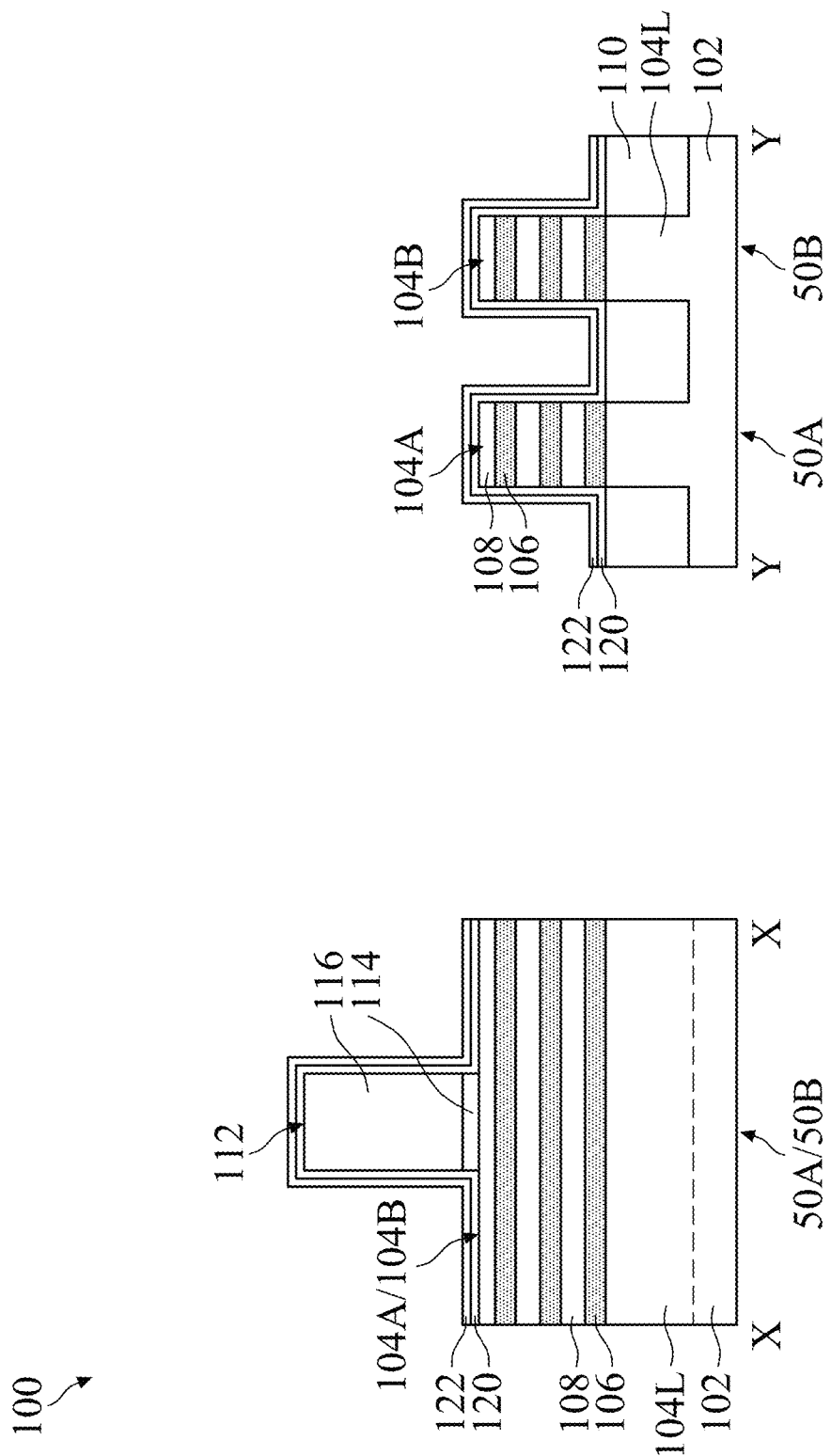

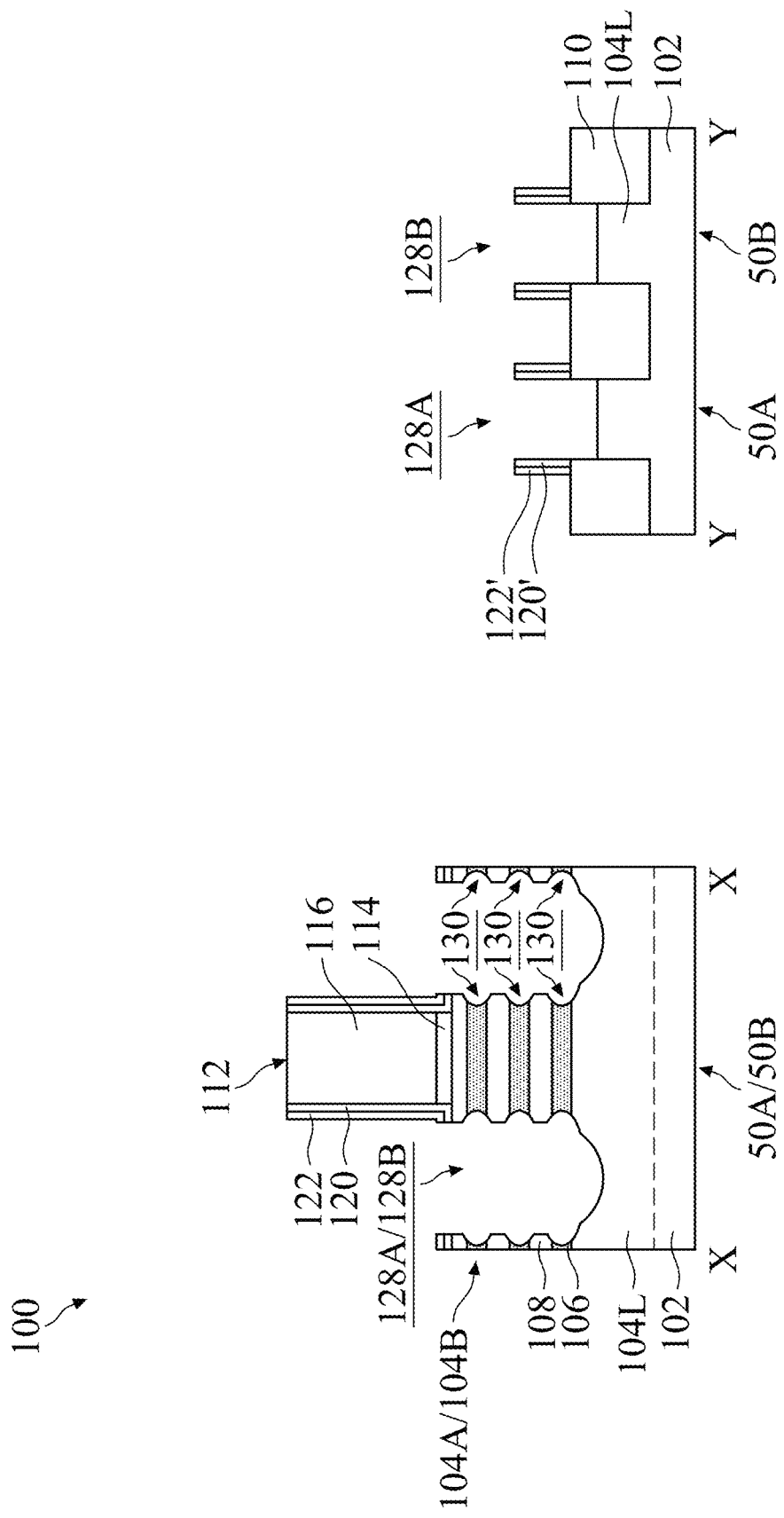

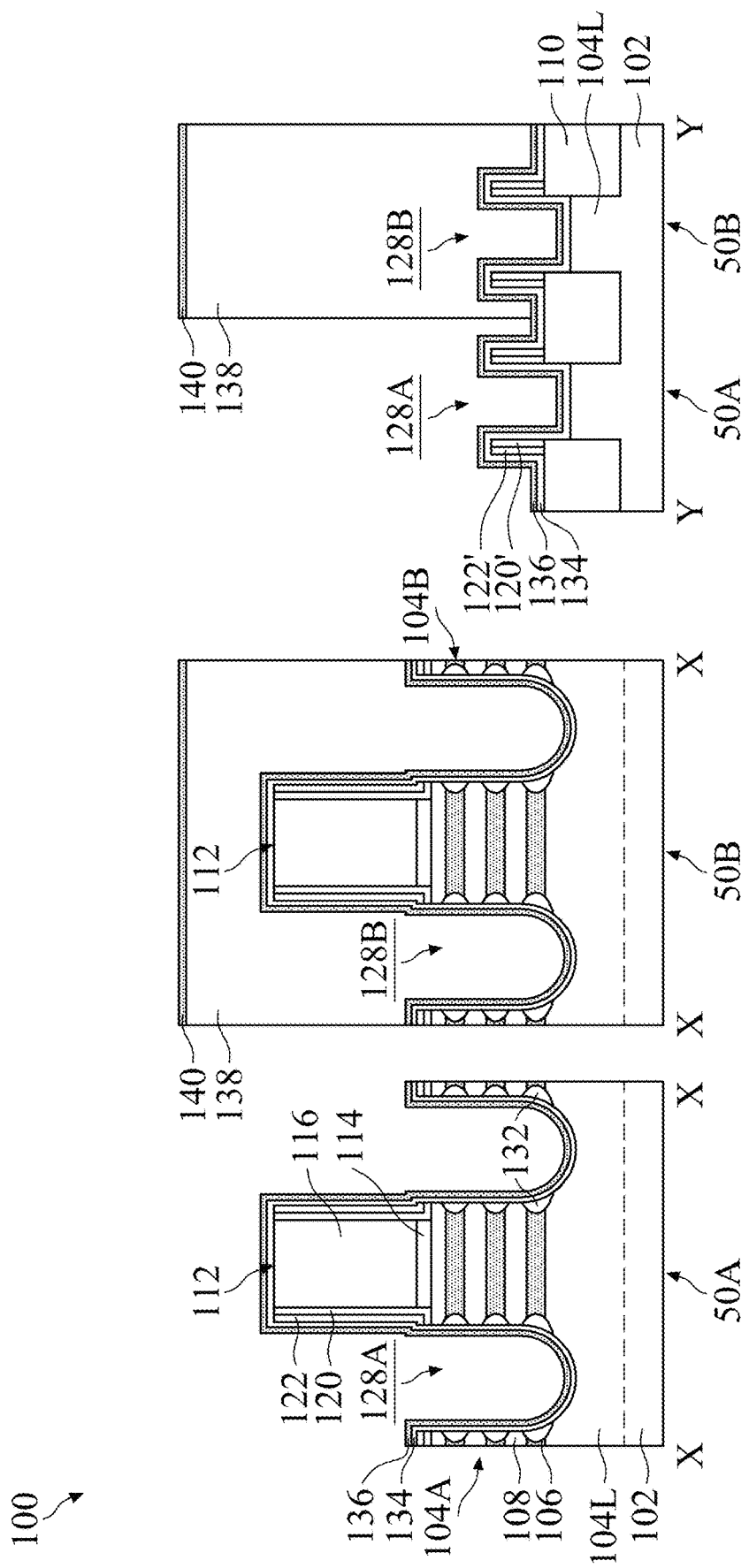

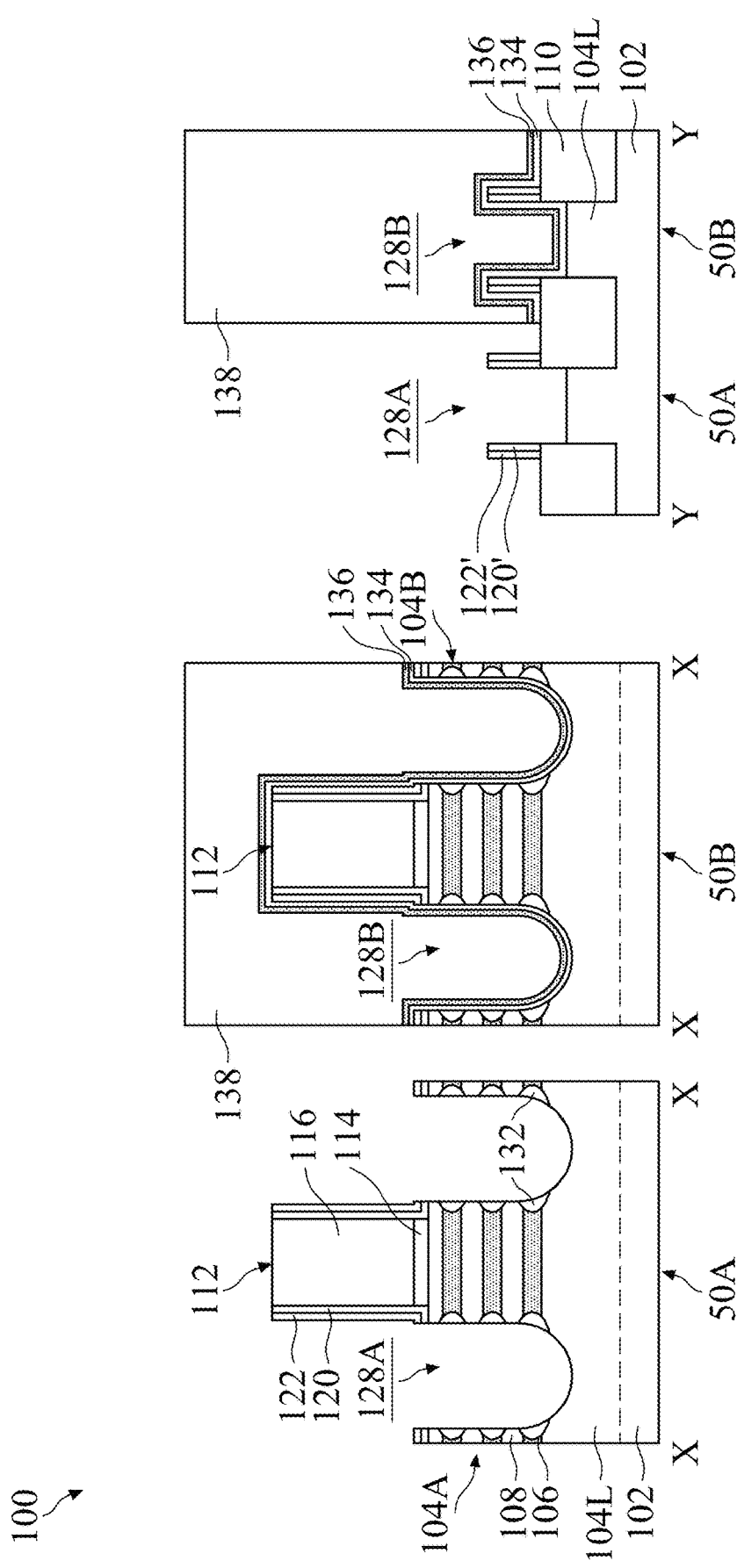

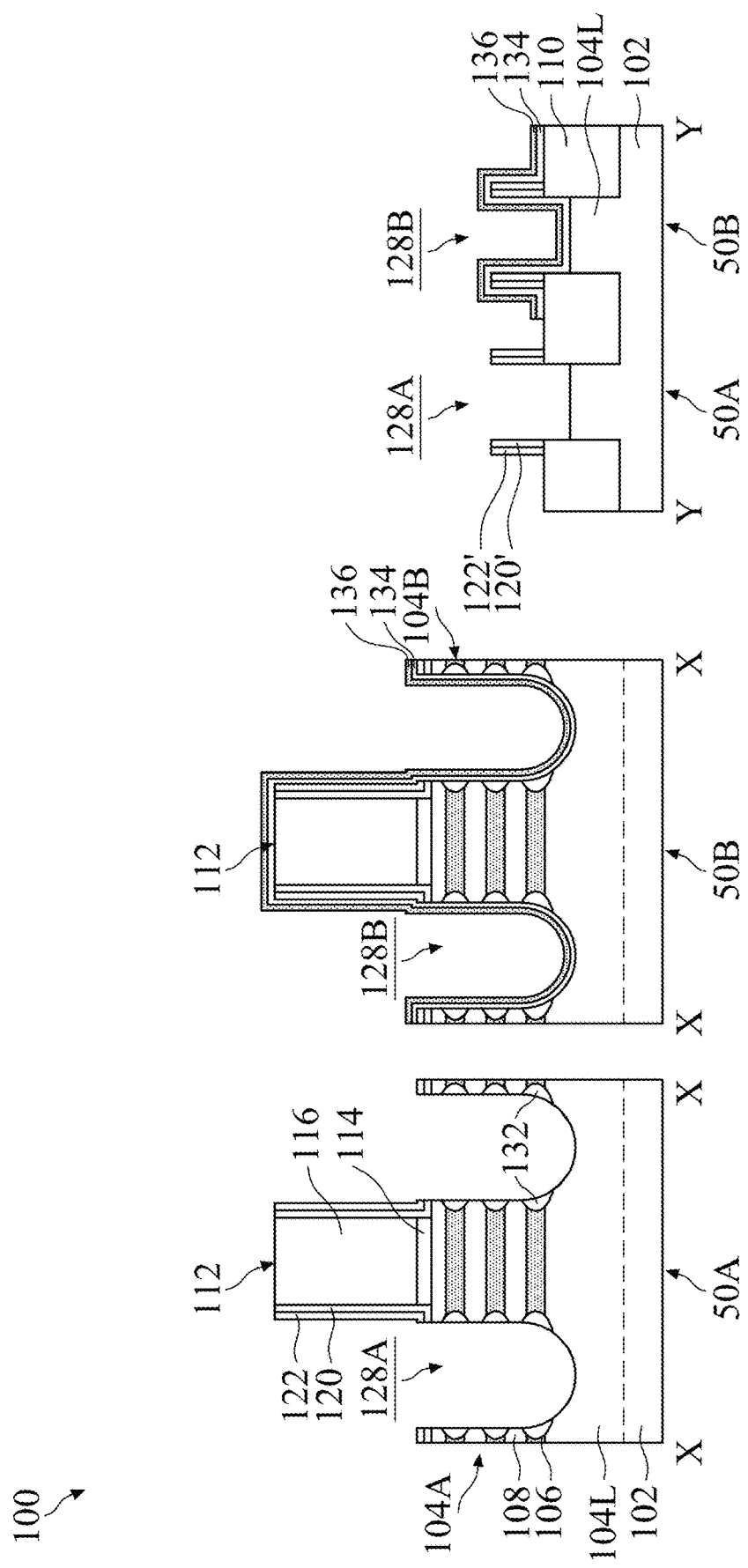

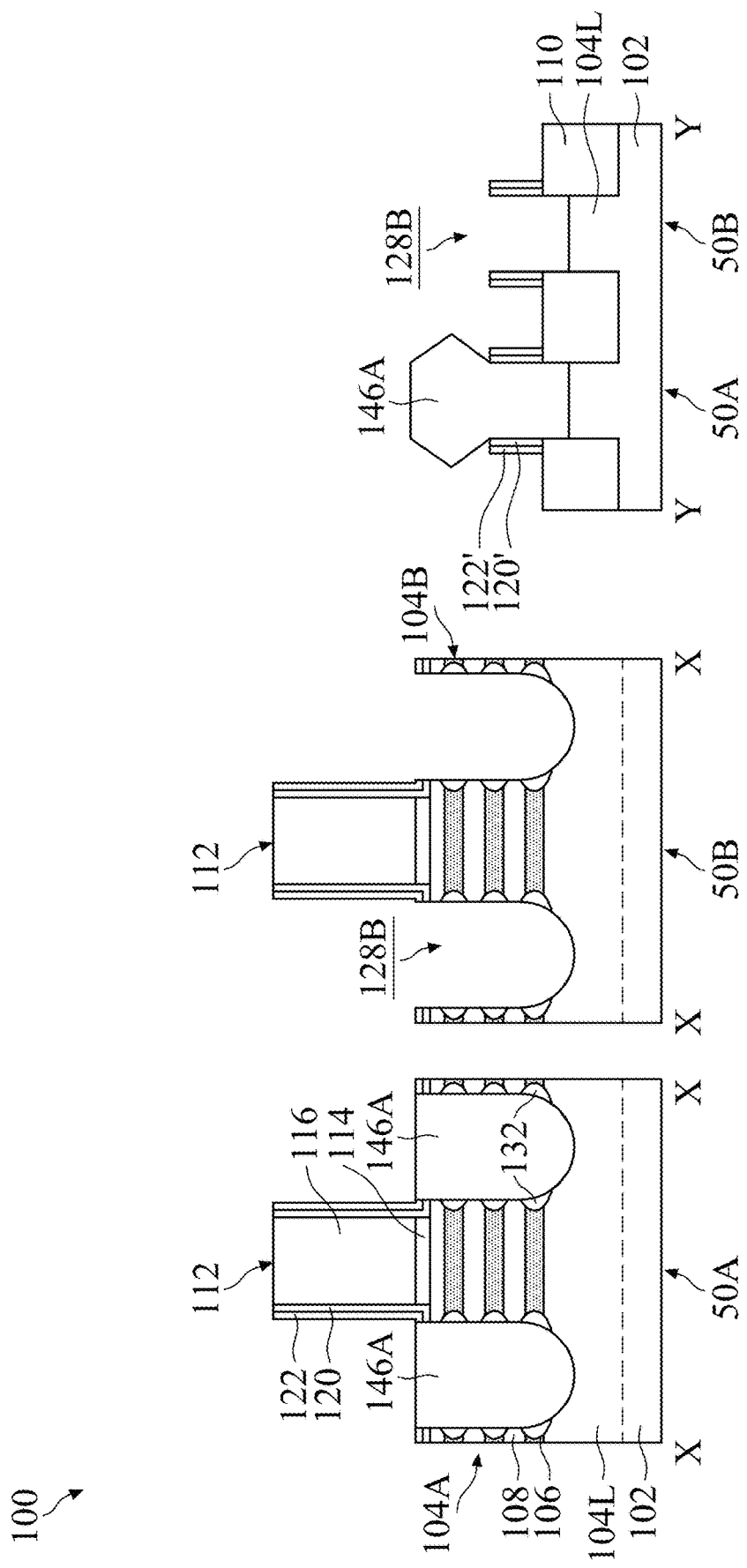

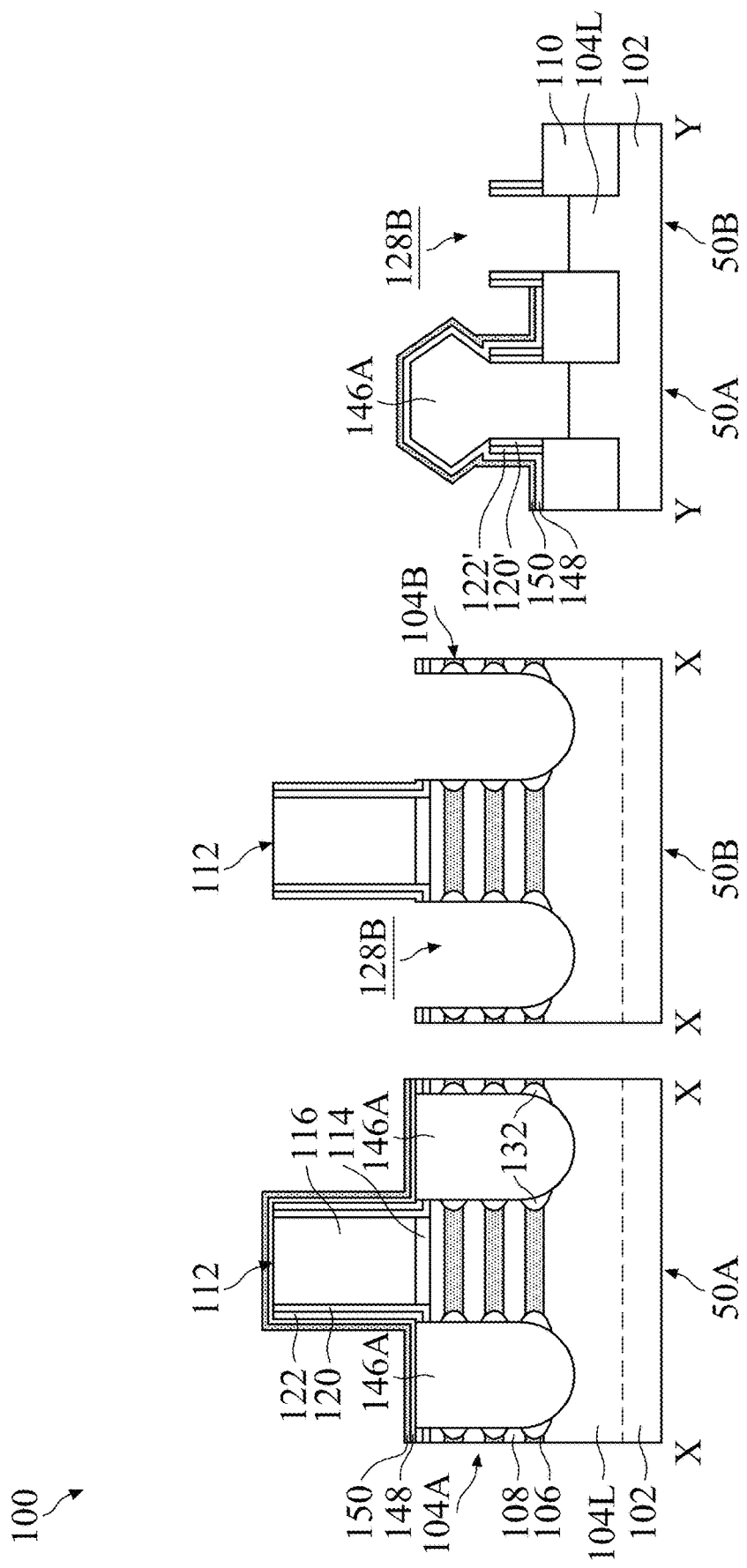

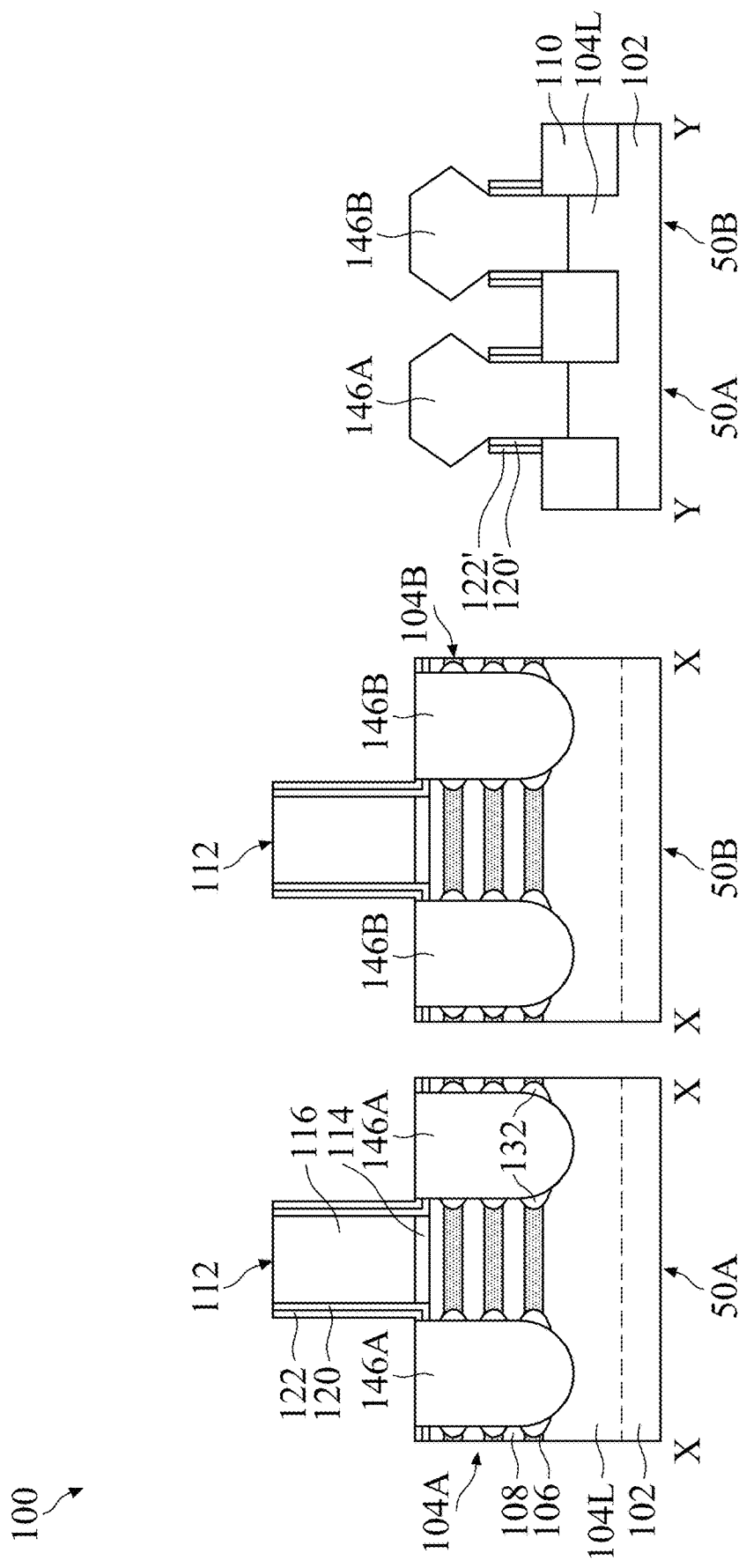

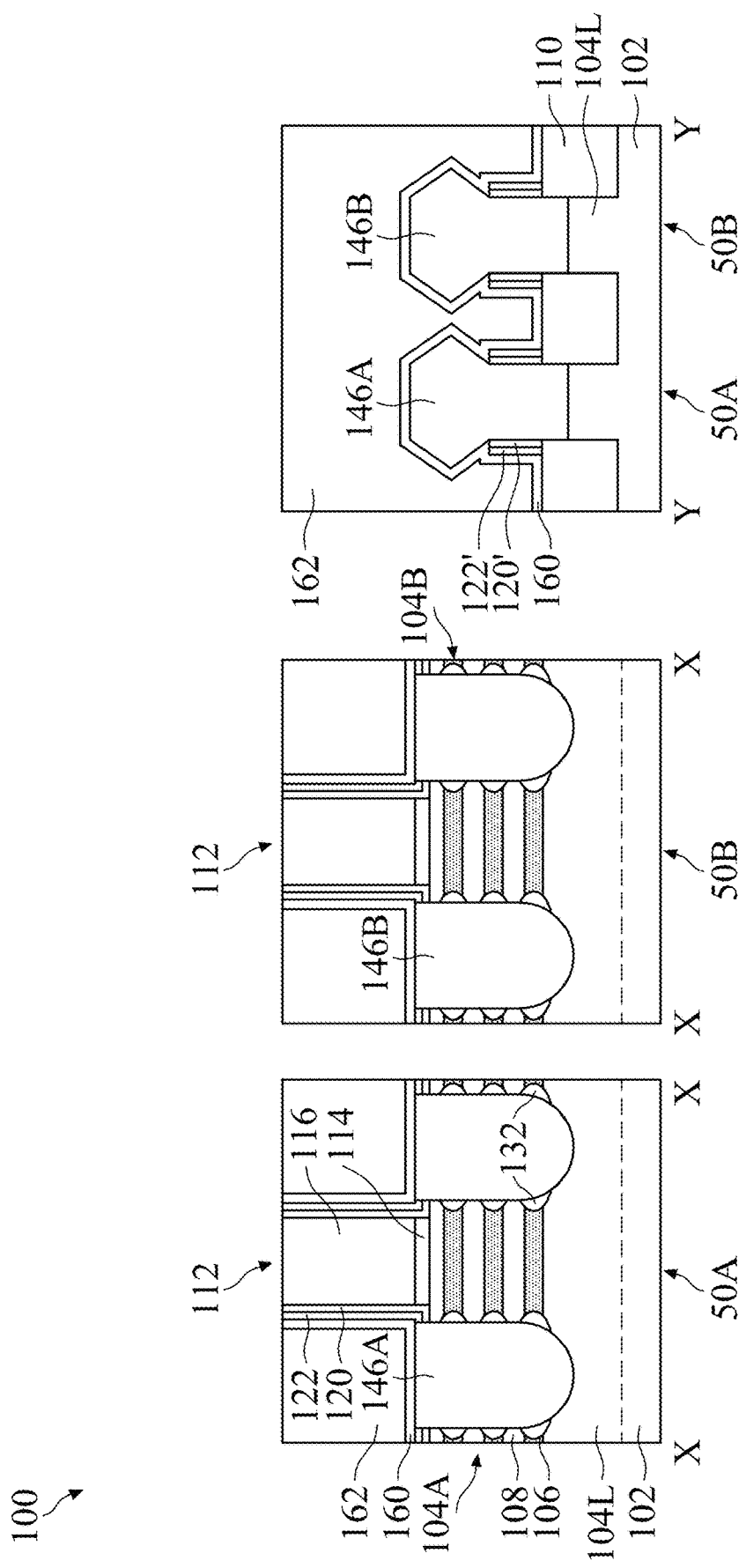

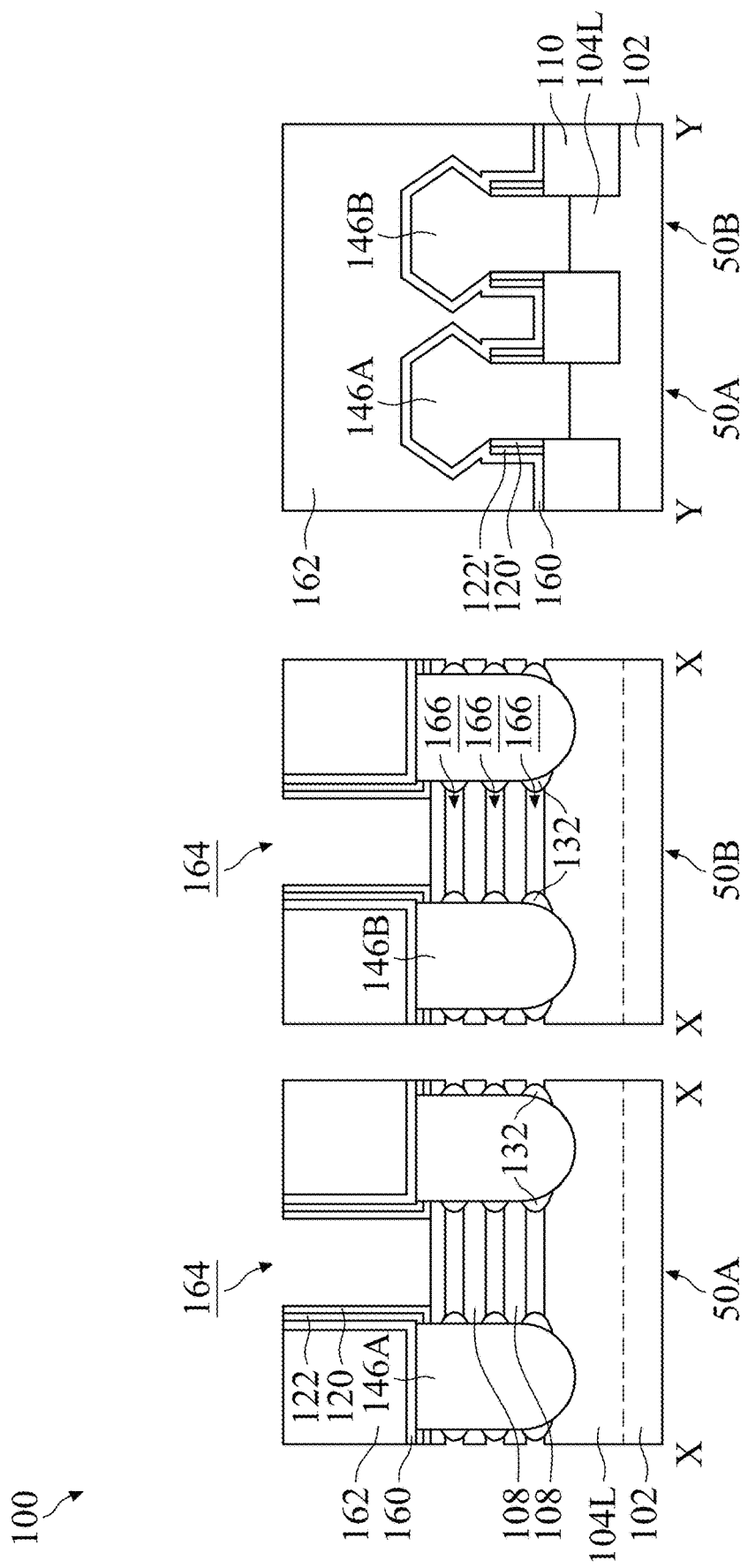

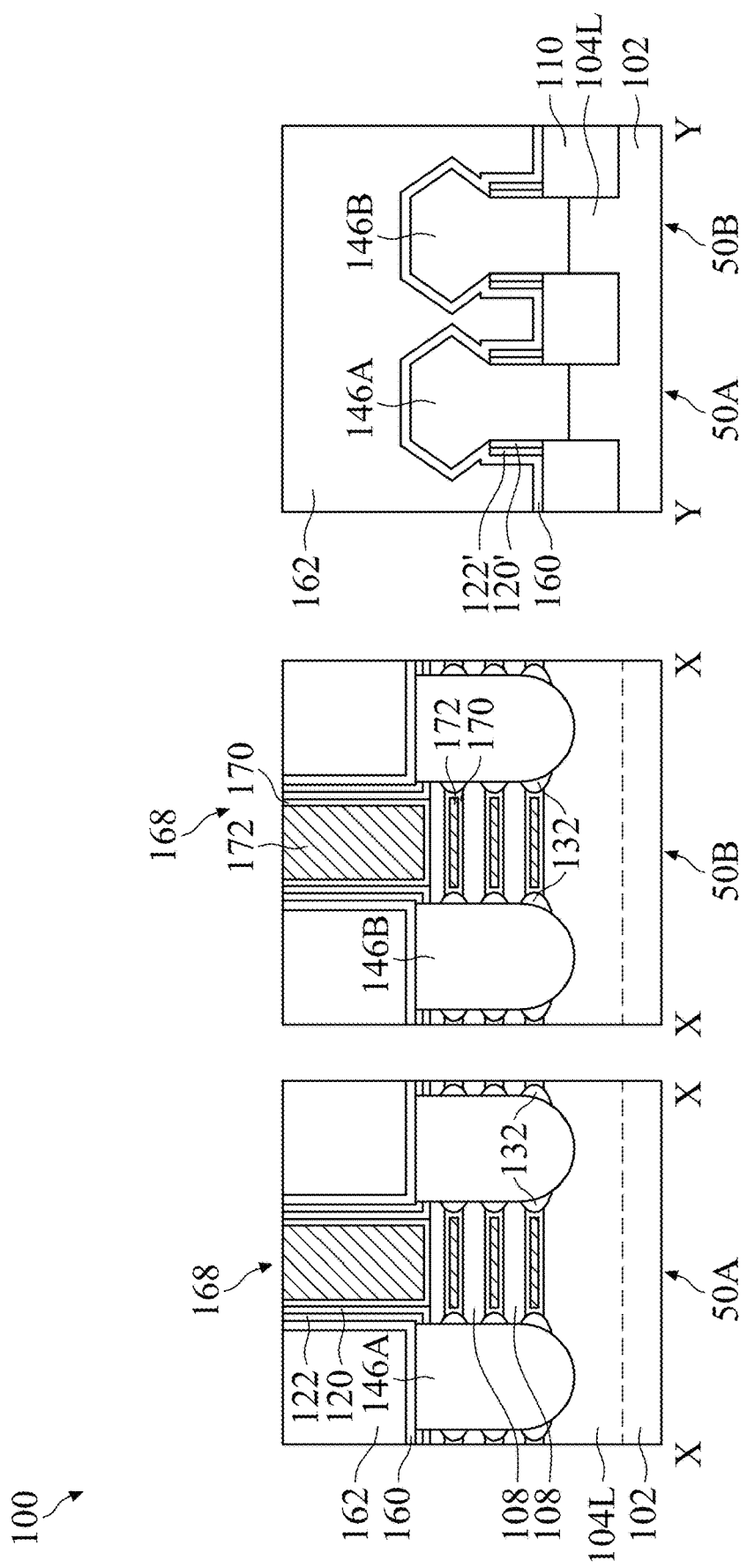

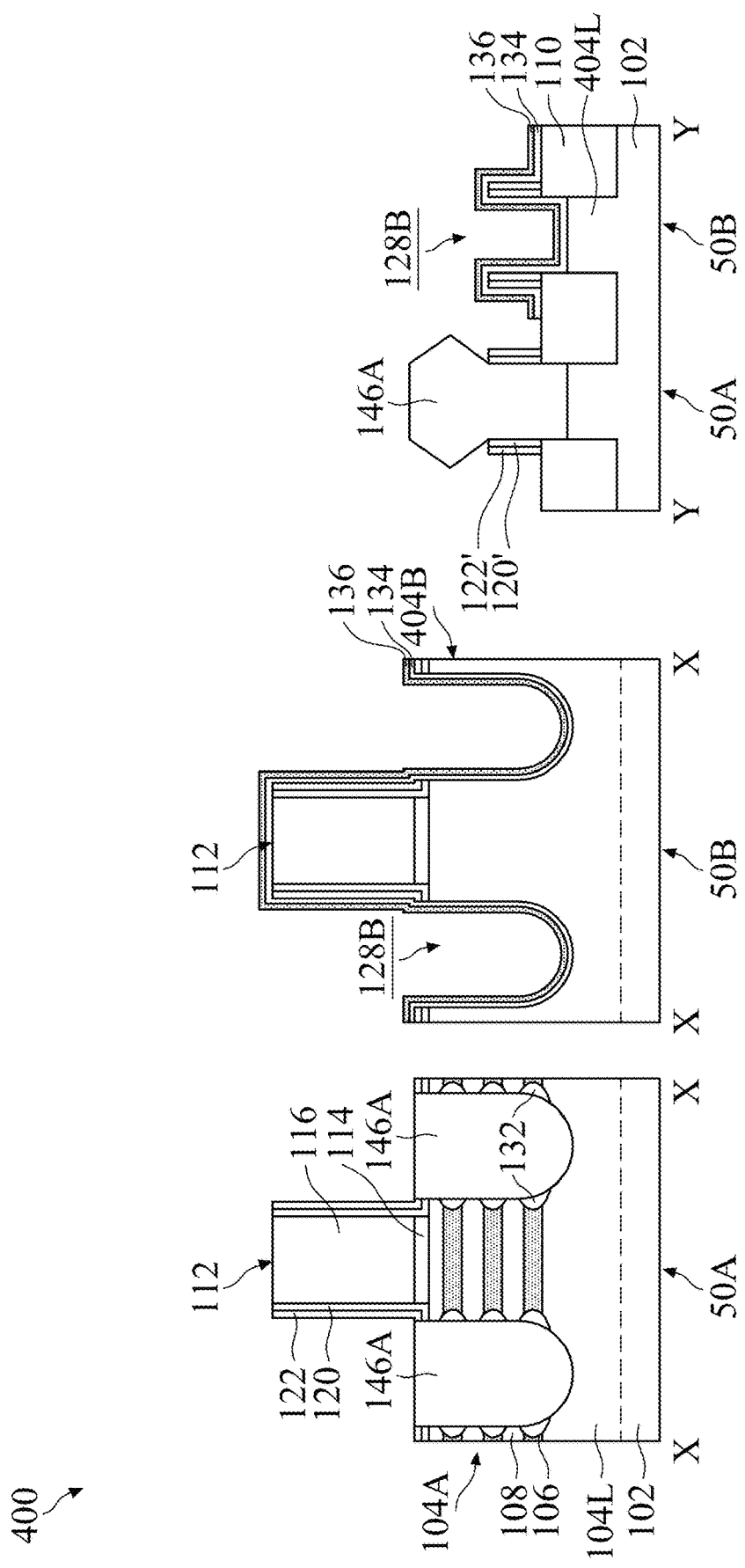

METHOD FOR FORMING SEMICONDUCTOR STRUCTURE

RELATED APPLICATIONS

The present application is a continuation application of U.S. application Ser. No. 17/237,249, filed on Apr. 22, 2021, entitled of "METHOD FOR FORMING SEMICONDUCTOR STRUCTURE WITH FINS USING A MULTILAYER MASK STRUCTURE FOR ETCHING TO FORM NANOSTRUCTURES," which is incorporated herein by reference in its entirety.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1 through 2U-2 are cross-sectional views illustrating the formation of a semiconductor structure at various intermediate stages, in accordance with some embodiments of the disclosure.

FIGS. 5A-1 through 5E-2 are cross-sectional views illustrating the formation of a semiconductor structure at various intermediate stages, in accordance with some embodiments of the disclosure.

DETAILED DESCRIPTION

Figure 1:
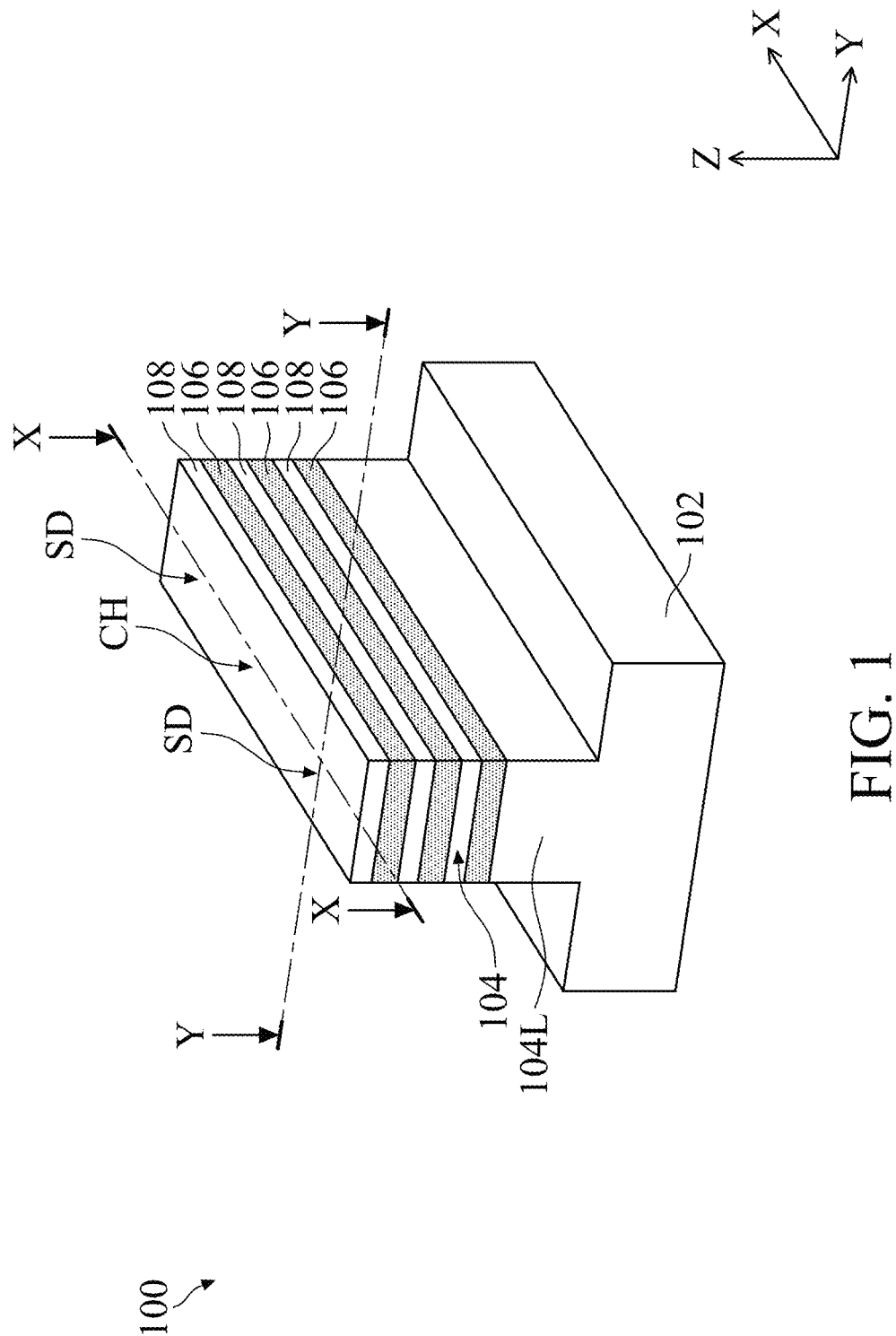
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a method for forming a semiconductor structure are provided. The aspect of the present disclosure is directed to separately forming source/drain features in different device regions. The method may include forming a silicon-containing dielectric mask layer and a high-k dielectric mask layer over the silicon-containing dielectric mask layer, patterning the dielectric mask layers into a source/drain mask structure that covers a device region and exposes another device region, and then growing source/drain features in the exposed device region. The embodiments of the present disclosure use the silicon-containing dielectric mask layer as the bottom layer of the source/drain mask structure, which may provide a good balance between the loss of the low-k spacers (such as the gate spacer layers and/or the inner spacers) and the amount of residue of the source/drain mask structure. Therefore, the process window of patterning the source/drain mask structure is enlarged.

FIG. 1 is a perspective view of a semiconductor structure, in accordance with some embodiments. A semiconductor structure 100 is received or provided, as shown in FIG. 1, in accordance with some embodiments. The semiconductor structure 100 includes a substrate 102 and a fin structure 104 over the substrate 102, in accordance with some embodiments. Although one fin structure 104 is illustrated in FIG. 1, more than one fin structures 104 may be formed over a single device region and/or multiple device regions of the semiconductor structure 100.

For a better understanding of the semiconductor structure, X-Y-Z coordinate reference is provided in the figures of the present disclosure. X-axis and Y-axis are generally orientated along the lateral (or horizontal) directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

The fin structure 104 includes a lower fin element 104L formed from a portion of the substrate 102 and an upper fin element formed from an epitaxial stack including alternating first semiconductor layers 106 and second semiconductor layer 108, in accordance with some embodiments. The fin structure 104 extends in X direction, in accordance with some embodiments. That is, the fin structure 104 has a longitudinal axis parallel to X direction, in accordance with some embodiments. X direction may also be referred to as the channel-extending direction. The current of the resulting semiconductor device (i.e., GAAFET) flows in X direction through the channel.

The fin structure 104 includes a channel region CH and source/drain regions SD, where the channel region CH is defined between the source/drain regions SD, in accordance with some embodiments. In this disclosure, a source/drain refers to a source and/or a drain. It is noted that in the present disclosure, a source and a drain are interchangeably used and the structures thereof are substantially the same. FIG. 1 shows one channel region CH and two source/drain regions SD for illustrative purpose and is not intended to be limiting. The number of the channel region CH and the source/drain regions may be dependent on the semiconductor device design demand and/or performance consideration. Gate structure or gate stack (not shown) will be formed with a longitudinal axis parallel to Y direction and extending across and/or surrounds the channel region CH of the fin structure 104. Y direction may also be referred to as a gate-extending direction.

FIG. 1 further illustrates a reference cross-section that is used in later figures. Cross-section X-X is in a plan parallel to the longitudinal axis (X direction) and through the fin structure 104, in accordance with some embodiments. Cross-section Y-Y is in a plan parallel to the longitudinal axis (Y direction) and across the source/drain region SD of the fin structure 104, in accordance with some embodiments.

FIGS. 2A-1 through 2U-2 are cross-sectional views illustrating the formation of a semiconductor structure at various intermediate stages, in which the figures ending with "-1" (such as FIG. 2A-1) are cross-sectional views corresponding to cross-section X-X shown in FIG. 1, and the figures ending with "-2" (such as FIG. 2A-2) are cross-sectional views corresponding to cross-section Y-Y shown in FIG. 1, in accordance with some embodiments.

Figures 1, 2, 2D:
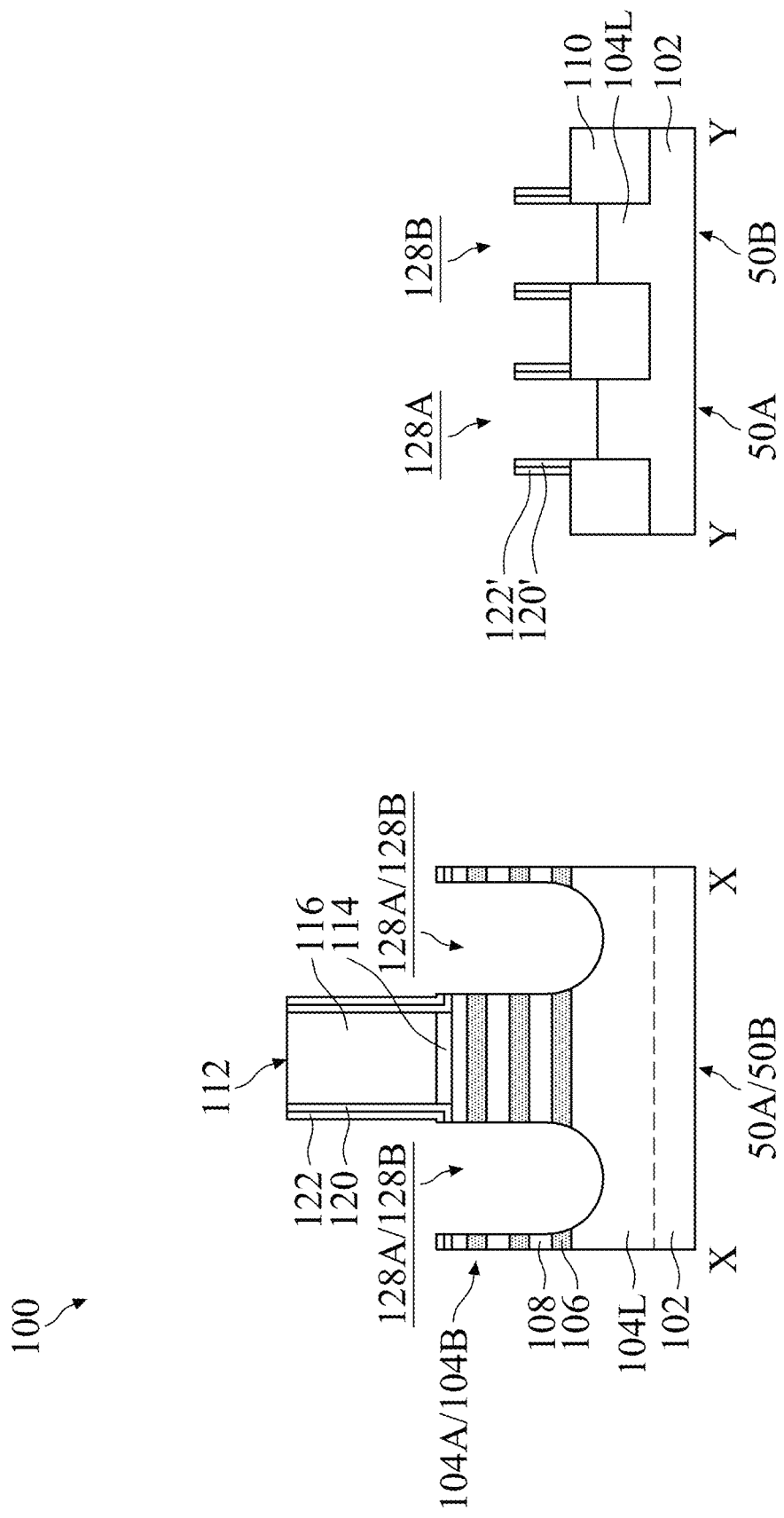

FIGS. 2A-1 and 2A-2 are cross-sectional views of a semiconductor structure 100 after the formation of fin structures 104A and 104B and an isolation structure 110, in accordance with some embodiments.

A semiconductor structure 100 including a substrate 102 and fin structures 104A and 104B is received or provided, as shown in FIGS. 2A-1 and 2A-2, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The substrate 102 includes a first device region 50A where a fin structure 104A is formed and a second device region 50B where a fin structure 104B are formed, as shown in FIGS. 2A-1 and 2A-2, in accordance with some embodiments. In some embodiments, the first device region 50A is a p-type device region and used for forming p-type semiconductor devices (e.g., p-channel nanostructure transistors such as p-channel gate-all-around transistors). In some embodiments, the second device region 50B is an n-type device region and used for forming n-type semiconductor devices (e.g., n-channel nanostructure transistors such as n-channel gate-all-around transistors). Although the first device region 50A and the second device region 50B are illustrated as being immediately adjacent to each other, the first device region 50A may be physically separated from the second device region 50B. Any number of device features (e.g., other active devices, doped regions, isolation structures, etc.) may be disposed between the first device region 50A and the second device region 50B.

The formation of the fin structures 104A and 104B includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shaped and/or sheet shape. Gate stack (not shown) will be formed across and wrap around the nanostructures, in accordance with some embodiments.

In some embodiments, the thickness of each of the first semiconductor layers 106 is in a range from about 5 nm to about 20 nm. In some embodiments, the thickness of each of the second semiconductor layers 108 is in a range from about 5 nm to about 20 nm. The thickness of the second semiconductor layers 108 may be greater than, equal to, or less than the second protection layer 108, which may depend on the amount of gate materials to be filled in spaces where the first semiconductor layers 106 are removed. Although three first semiconductor layers 106 and three second semiconductor layers 108 are shown in FIGS. 1A-1 and 1A-2, the numbers are not limited to three, and can be 1, 2, or more than 3, and is less than 20. By adjusting the number of the semiconductor layers, a driving current of the resulting GAAFET device can be adjusted.

The epitaxial stack including the first semiconductor layers 106 and the second semiconductor layers 108 are then patterned into the fin structure 104A in the first device region 50A and the fin structure 104B in the second device region 50B, in accordance with some embodiments. In some embodiments, the patterning process includes forming a patterned hard mask layer (not shown) over the epitaxial stack. An etching process is then performed to remove portions of the epitaxial stack and underlying substrate 102 uncovered by the patterned hard mask layer, thereby forming trenches and the fin structures 104A and 104B protruding from between the trenches, in accordance with some embodiments. The etching process may be an anisotropic etching process, e.g., dry plasma etching.

The portion of the substrate 102 protruding from between the trenches forms lower fin elements 104L of the fin structures 104A and 104B, in accordance with some embodiments. A remainder of the epitaxial stack (including the first semiconductor layers 106 and the second semiconductor layers 108) forms the upper fin elements of the fin structures 104A and 104B over the respective lower fin elements 104L, in accordance with some embodiments.

In some embodiments, the fin structures 104A and 104B extend in X direction. That is, the fin structures 104A and 104B have longitudinal axes parallel to X direction, in accordance with some embodiments. FIG. 2A-2 shows one fin structure formed in each of the first device region 50A and the second device region 50B for illustrative purpose and is not intended to be limiting. The number of the fin structure 104A/104B in the device region 50A/50B may be dependent on the semiconductor device design demand and/or performance consideration.

An isolation structure 110 is formed to surround the lower fin elements 104L of the fin structures 104A and 104B, as shown in FIG. 2A-2, in accordance with some embodiments.

The isolation structure 110 is configured to electrically isolate active regions (e.g., the fin structures 104A and 104B) of the semiconductor structure 100 and is also referred to as shallow trench isolation (STI) feature, in accordance with some embodiments.

The formation of the isolation structure 110 includes forming an insulating material to overfill the trenches, in accordance with some embodiments. In some embodiments, the insulating material is made of silicon oxide, silicon nitride, silicon oxynitride (SiON), another suitable insulating material, multilayers thereof, and/or a combination thereof. In some embodiments, the insulating material is deposited using includes CVD (such as low-pressure CVD (LPCVD), plasma-enhanced CVD (PECVD), high density plasma CVD (HDP-CVD), high aspect ratio process (HARP), or flowable CVD (FCVD)), atomic layer deposition (ALD), another suitable technique, and/or a combination thereof. In some embodiments, the insulating material may be bi-layered, for example, a lining layer and a bulk layer over the lining layer. The lining layer may repair damage during the etching process that forms the fin structures. The bulk layer may have a good gap-fill ability to fill the trenches without forming voids or seams therein.

A planarization process is performed on the insulating material to remove a portion of the insulating material above the patterned hard mask layer (not shown) until the patterned hard mask layer (not shown) is exposed, in accordance with some embodiments. In some embodiments, the patterned hard mask layer is also removed in the planarization process, and the upper surfaces of the fin structures 104A and 104B are exposed. The planarization may be chemical mechanical polishing (CMP), etching back process, or a combination thereof. The insulating material is then recessed by an etching process (such as dry plasma etching and/or wet chemical etching) until the upper fin elements of the fin structures 104A or 104B are exposed, in accordance with some embodiments. The recessed insulating material forms the isolation structure 110.

FIGS. 2B-1 and 2B-2 are cross-sectional views of a semiconductor structure 100 after the formation of a dummy gate structure 112, in accordance with some embodiments.

Dummy gate structure 112 is formed over the semiconductor structure 100, as shown in FIG. 2B-1, in accordance with some embodiments. The dummy gate structure 112 extends across and surrounds the channel regions of the fin structures 104A and 104B to define the channel regions and the source/drain regions, in accordance with some embodiments. The dummy gate structure 112 is configured as a sacrificial structure and will be replaced with a final gate stack, in accordance with some embodiments. In some embodiments, the dummy gate structure 112 extends in Y direction. That is, the dummy gate structure 112 has a longitudinal axis parallel to the Y direction, in accordance with some embodiments. FIG. 2B-1 shows one dummy gate structures 128 for illustrative purpose and is not intended to be limiting. The number of the dummy gate structures 128 may be dependent on the semiconductor device design demand and/or performance consideration.

The dummy gate structure 112 includes a dummy gate dielectric layer 114 and a dummy gate electrode layer 116 formed over the dummy gate dielectric layer 114, as shown in FIG. 2B, in accordance with some embodiments. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof. In some embodiments, the dummy gate electrode layer 116 is made of semiconductor material such as polysilicon, poly-silicon germanium. In some embodiments, the dummy gate electrode layer 116 is made of a conductive material such as metallic nitrides, metallic silicides, metals, and/or a combination thereof. In some embodiments, the material for the dummy gate electrode layer 116 is formed using CVD, another suitable technique, and/or a combination thereof.

In some embodiments, the formation of the dummy gate structure 112 includes globally and conformally depositing a dielectric material for the dummy gate dielectric layer 114 over the semiconductor structure 100, depositing a material for the dummy gate electrode layer 116 over the dielectric material, planarizing the material for the dummy gate electrode layer 116, and patterning the dielectric material and the material for the dummy gate electrode layer 116 into the dummy gate structure 112. The patterning process includes forming a patterned hard mask layer (not shown) over the material for the dummy gate electrode layer 116 to cover the channel regions of the fin structures 104A and 104B, in accordance with some embodiments. The material for the dummy gate electrode layer 116 and dielectric material, uncovered by the patterned hard mask layer, is etched away until the source/drain regions of the fin structures 104A and 104B are exposed, in accordance with some embodiments.

FIGS. 2C-1 and 2C-2 are cross-sectional views of a semiconductor structure 100 after the formation of gate spacer layers 120 and 122, in accordance with some embodiments.

The gate spacer layers 120 and 122 are sequentially formed over the semiconductor structure 100, as shown in FIGS. 2C-1 and 2C-2, in accordance with some embodiments. The gate spacer layers 120 and 122 are formed along and cover the upper surface and the sidewalls of the dummy gate structure 112 (and the patterned mask layer if exist), the upper surfaces and the sidewalls of the upper fin elements of the fin structures 104A and 104B, and the upper surface of the isolation structure 110, in accordance with some embodiments.

In some embodiments, the gate spacer layers 120 and 122 are made of a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the gate spacer layers 120 and 122 are globally and conformally deposited using atomic layer deposition (ALD), CVD (such as LPCVD, PECVD, HDP-CVD, HARP, and FCVD), another suitable method, and/or a combination thereof.

In some embodiments, the gate spacer layers 120 and 122 are made of low-k dielectric materials. For example, the dielectric constant (k) values of the gate spacer layers 120 and 122 may be lower than the k-value of silicon oxide (SiO), such as lower than 4.2, equal to or lower than about 3.9, such as in a range from about 3.5 to about 3.9. In some embodiments, the gate spacer layer 120 and the gate spacer layer 122 are made of different materials and have different dielectric constant values. For example, the gate spacer layers 120 is a SiOCN layer and the gate spacer layers 122 is a Si(O)CN layer. The oxygen concentration in the SiOCN layer may be greater than the oxygen concentration in the Si(O)CN layer. In some embodiments, the gate spacer layer 120 has a thickness in a range from about 10 angstroms (Å) to about 60 Å. In some embodiments, the gate spacer layer 122 has a thickness in a range from about 15 Å to about 90 Å.

FIGS. 2D-1 and 2D-2 are cross-sectional views of a semiconductor structure 100 after the formation of source/drain recesses 128A and 128B, in accordance with some embodiments.

One or more etching process is performed to removes horizontal portions of the gate spacer layers 120 and 122 and then recess the source/drain regions of the fin structures 104A and 104B, thereby forming source/drain recesses 128A in the first device region 50A and source/drain recesses 128B in the second device region 50B, as shown in FIGS. 2D-1 and 2D-2, in accordance with some embodiments. The one or more etching process may be an anisotropic etching process such as dry plasma etching, an isotropic etching process such as dry chemical etching, remote plasma etching or wet chemical etching, and/or a combination thereof.

For example, in some embodiments, a first etching process is performed to remove horizontal portions of the gate spacer layers 120 and 122 along lateral surfaces (such as the upper surface of the dummy gate structure 112, the upper surface of the upper fin elements of the fin structures 104A and 104B, and the upper surface of the isolation structure 110). After the first etching process, the source/drain regions of the fin structures 104A and 104B are exposed, in accordance with some embodiments. Vertical portions of the gate spacer layers 120 and 122 are left remaining on the sidewalls of the dummy gate structure 112 to act as gate spacers, in accordance with some embodiments. The gate spacers are used to offset the subsequently formed source/drain features and separate the source/drain features from the gate structure, in accordance with some embodiments. Furthermore, vertical portions of the gate spacer layers 120 and 122 are also left remaining on the sidewalls of the upper fin elements of the fin structures 104A and 104B to act as fin spacer layers and denoted as 120' and 122', as shown in FIG. 2D-2, in accordance with some embodiments.

Afterward, a second etching process is performed using the gate spacers 120 and 122 and the dummy gate structure 112 as etch mask to recess the source/drain regions of the fin structures 104A and 104B such that the source/drain recess 128A/128B are formed self-aligned on the opposite sides of the dummy gate structure 112, in accordance with some embodiments. In some embodiments, the first and second etching processes are performed without an additional photolithography process. The source/drain recesses 128A and 128B pass through the upper fin element of the fin structure 104, in accordance with some embodiments. The bottom surfaces of the source/drain recesses 128A and 128B may extend to a position substantially below the upper surface of the isolation structure 110, in accordance with some embodiments.

FIGS. 2E-1 and 2E-2 are cross-sectional views of a semiconductor structure 100 after the formation of notches 130, in accordance with some embodiments.

An etching process is performed on the semiconductor structure 100 to laterally recess, from the source/drain recesses 128A and 128B, the first semiconductor layers 106 of the fin structures 104A and 104B to form notches 130, as shown in FIG. 2E-2, in accordance with some embodiments. In some embodiments, in the etching process, the first semiconductor layers 106 have a greater etching rate (or etching amount) than the second semiconductor layers 108, thereby forming notches 144 between adjacent second semiconductor layers 108 and between the lowermost second semiconductor layer 108 and the lower fin element 104L. In some embodiments, the etching process is an isotropic etching such as dry chemical etching, remote plasma etching, wet chemical etching, another suitable technique, and/or a combination thereof. In some embodiments, the notches 130 extend, from the source/drain regions toward the channel region, directly below the gate spacer layers 120 and 122, in accordance with some embodiments. In some embodiments, the notches 130 has sidewalls that are curved, (i.e., concave surface of the first semiconductor layers toward the channel region). In some embodiments, the end portions of the second semiconductor layers 108 of the fin structures 104A and 104B are recessed by the etching process.

Figures 1, 2, 2F:
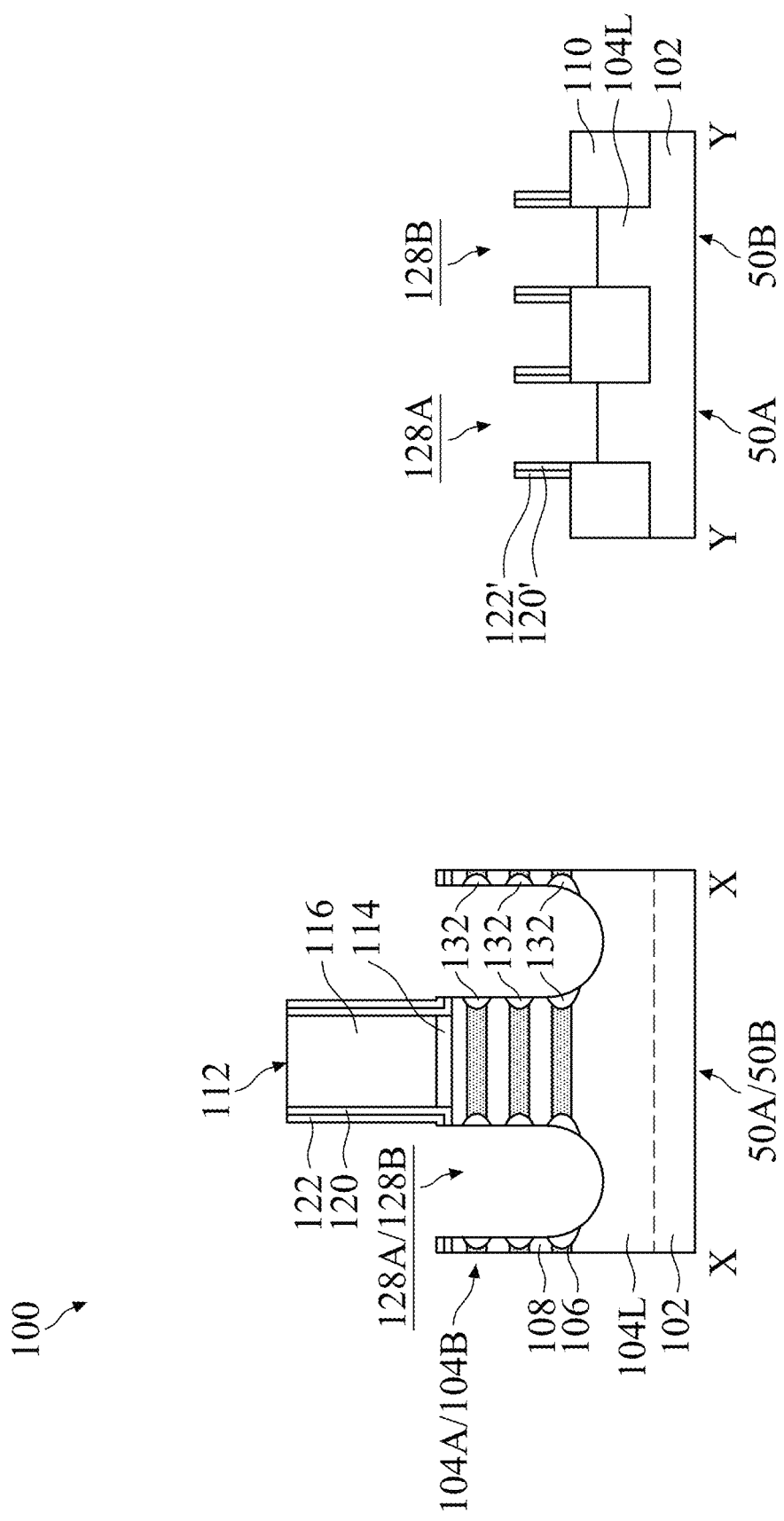

FIGS. 2F-1 and 2F-2 are cross-sectional views of a semiconductor structure 100 after the formation of inner spacer layers 132, in accordance with some embodiments.

Inner spacer layers 132 are formed in the notches 130 to abut the recessed side surfaces of the first semiconductor layers 106, as shown in FIG. 2F-1, in accordance with some embodiments. The inner spacer layers 132 interpose subsequently formed source/drain features and gate stack to avoid the source/drain features and the gate stack from being in direct contact and are configured to reduce the parasitic capacitance between the metal gate stack and the source/drain features (i.e. Cgs and Cgd), in accordance with some embodiments.

In some embodiments, the inner spacer layers 132 are made of a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 132 are made of low-k dielectric materials. For example, the dielectric constant (k) values of the inner spacer layers 132 may be lower than a k-value of silicon oxide (SiO), such as lower than 4.2, equal to or lower than about 3.9, such as in a range from about 3.5 to about 3.9.

In some embodiments, the inner spacer layers 132 are formed by globally and conformally depositing a dielectric material for the inner spacer layers 132 over the semiconductor structure 100 to fill the notches 130, and then etching back the dielectric material to remove the dielectric material outside the notches 130. The dielectric material remaining in the notches 130 forms the inner spacer layers 132, in accordance with some embodiments. In some embodiments, the deposition process includes ALD, CVD (such as PECVD, LPCVD or HARP), another suitable technique, and/or a combination thereof. In some embodiments, the etching-back process includes an anisotropic etching process such as dry plasma etching, an isotropic etching process such as dry chemical etching, remote plasma etching or wet chemical etching, and/or a combination thereof. In some embodiments, seams (not shown) may be formed within the inner spacer layers 132 due to the conformal deposition.

Figures 1, 2, 2G:
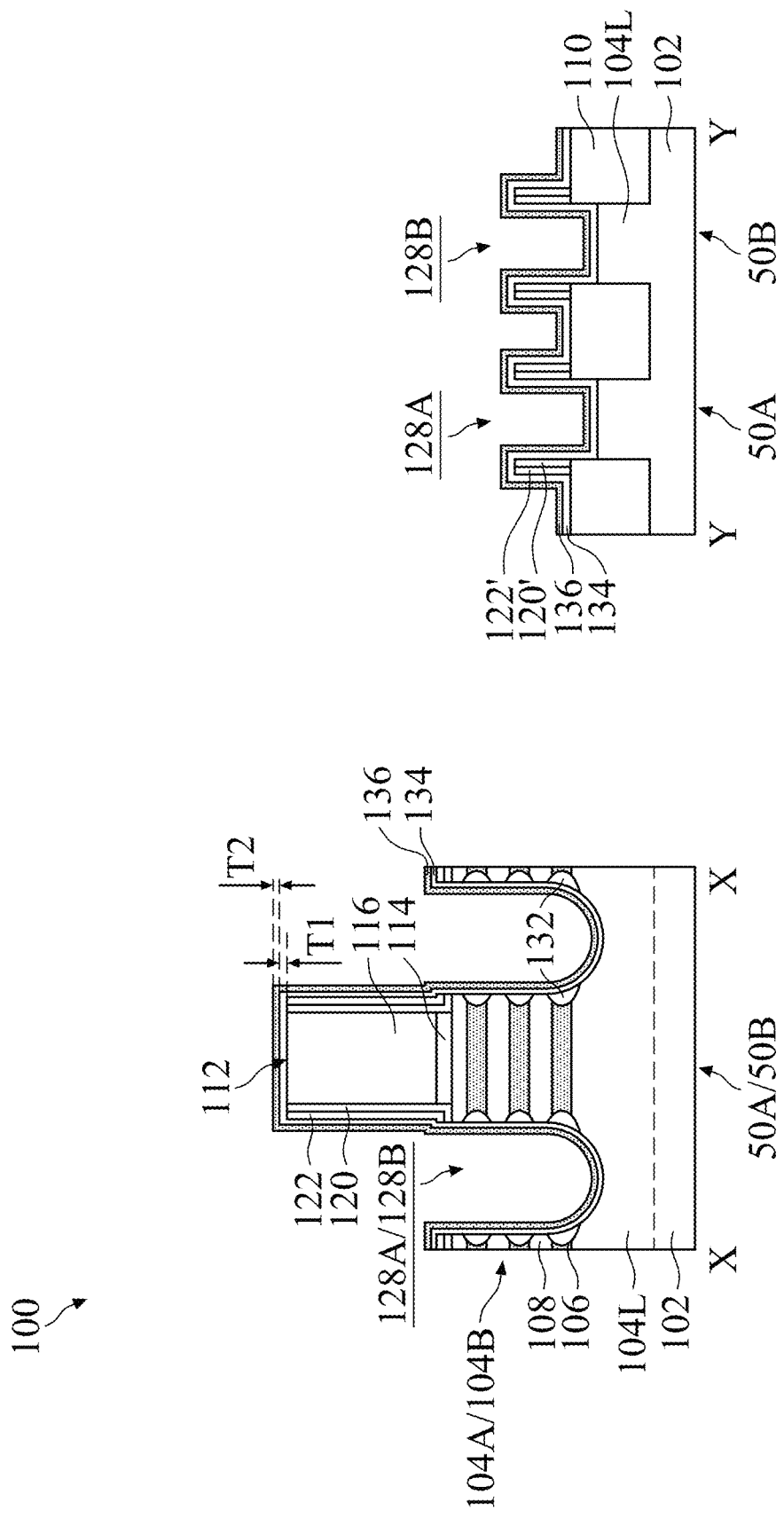

FIGS. 2G-1 through 2L-2 illustrate the formation of a source/drain mask structure for the second device region 50B. FIGS. 2G-1 and 2G-2 are cross-sectional views of a semiconductor structure 100 after the formation of dielectric mask layers 134 and 136, in accordance with some embodiments.

A first dielectric mask layer 134 is formed over the semiconductor structure 100, as shown in FIGS. 2G-1 and 2G-2, in accordance with some embodiments. The first dielectric mask layer 134 is formed along and covers the bottom surfaces and the sidewalls of the source/drain recesses 128A and 128B, the sidewalls and the upper surfaces of the gate spacer layer 122 and 120, and the upper surface of the dummy gate electrode layer 116, in accordance with some embodiments. The first dielectric mask layer 134 is also formed along and covers the upper surfaces and the sidewalls of the fin spacer layers 120' and 122' and the upper surface of the isolation structure 110, in accordance with some embodiments.

In some embodiments, the first dielectric mask layer 134 is made of a silicon-containing dielectric material, such as silicon oxide ($SiO_2$), silicon nitride (SiN), silicon carbide (SiC), silicon oxynitride (SiON), another suitable silicon-containing dielectric material, and/or a combination thereof. In some embodiments, the first dielectric mask layer 134 is globally and conformally deposited using ALD, CVD (such as LPCVD, PECVD, HDP-CVD, HARP, and FCVD), another suitable method, and/or a combination thereof.

In some embodiments, the first dielectric mask layer 134 is made of a different material than the gate spacer layers 120 and 122 and the inner spacers 132. The first dielectric mask layer 134 has a different etching selectivity than the gate spacer layers 120 and 122 and the inner spacers 132. In some embodiments, the first dielectric mask layer 134 is made of a low-k dielectric material, e.g., having k-value lower than about 7. In an embodiment, the first dielectric mask layer 134 is made of silicon oxide ($SiO_2$). The first dielectric mask layer 134 has a higher dielectric constant value than the gate spacer layers 120 and 122 and the inner spacers 132, in accordance with some embodiments. In some embodiments, the first dielectric mask layer 134 has a thickness T1 in a range from about 10 Å to about 50 Å.

A second dielectric mask layer 136 is formed over the first dielectric mask layer 134, as shown in FIGS. 2G-1 and 2G-2, in accordance with some embodiments. The first and second dielectric mask layers 134 and 136 partially fill the source/drain recesses 128A and 128B, in accordance with some embodiments.

In some embodiments, the second dielectric mask layer 136 is made of a silicon-free dielectric material. In some embodiments, the second dielectric mask layer 136 is made of oxide of amphoteric metal, such as zinc oxide (ZnO), aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$), and/or a combination thereof. In some embodiments, the second dielectric mask layer 136 is globally and conformally deposited using ALD, CVD (such as LPCVD, PECVD, HDP-CVD, HARP, and FCVD), physical vapor deposition (PVD), another suitable method, or a combination thereof. In some embodiments, the second dielectric mask layer 136 is also formed on the backside and the sidewall (or bevel) of the wafer. After the deposition process, a clean process may be performed to remove the second dielectric mask layer 136 formed on the backside and the sidewall (or bevel) of the wafer. The second dielectric mask layer 136 formed on the frontside of the wafer is not cleaned, so there is no material loss.

In some embodiments, the second dielectric mask layer 136 is made of a different material than the first dielectric mask layer 134. The second dielectric mask layer 136 has a different etching selectivity than the first dielectric mask layer 134, in accordance with some embodiments. In some embodiments, the second dielectric mask layer 136 is made of a high-k dielectric material, e.g., having k-value greater than about 7. In an embodiment, the second dielectric mask layer 136 is made of aluminum oxide ($Al_2O_3$). In some embodiments, the second dielectric mask layer 136 has a higher dielectric constant value than the first dielectric mask layer 134, the gate spacer layers 120 and 122 and the inner spacers 132. In some embodiments, the second dielectric mask layer 136 has a thickness T2 in a range from about 10 Å to about 50 Å. In some embodiments, the thickness T2 of the second dielectric mask layer 136 is greater than, substantially the same as, or less than the thickness T1 of the first dielectric mask layer 134.

Figures 1, 2, 2H:
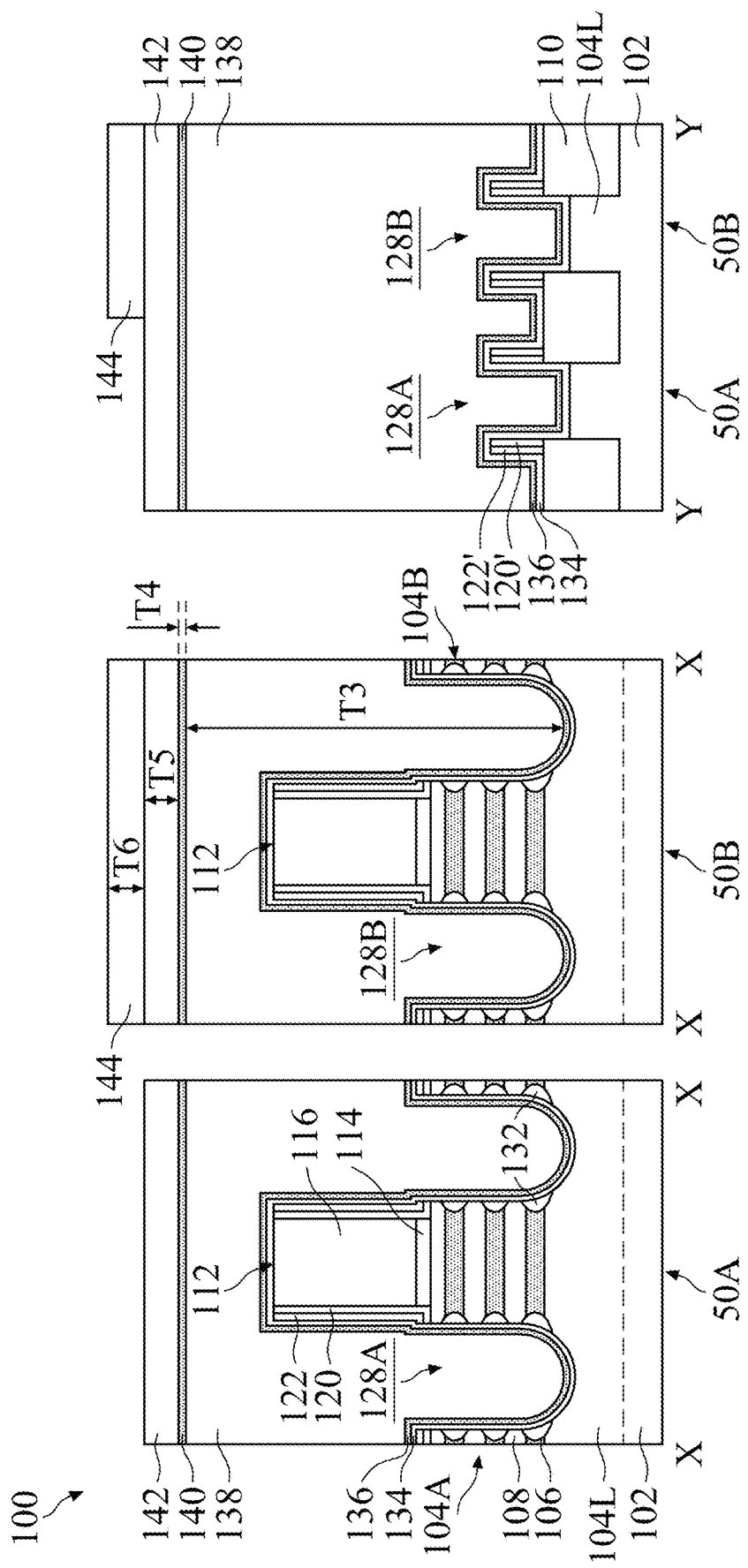

FIGS. 2H-1 and 2H-2 are cross-sectional views of a semiconductor structure 100 after the formation of a tri-layer mask structure, in accordance with some embodiments.

A fill layer 138 is formed over the second dielectric mask layer 136 and overfills the remainders of the source/drain recesses 128A and 128B, as shown in FIGS. 2H-1 and 2H-2, in accordance with some embodiments. The fill layer 138 is formed above the upper surface of the dummy gate structure 112, in accordance with some embodiments. The fill layer 138 may be used as a planarization layer to provide a substantially planar surface for a following photolithography process.

In some embodiments, the fill layer 138 is a bottom anti-reflective coating (BARC) layer such as an inorganic material or an organic material (e.g., polymer, oligomer, or monomer). In some embodiments, the fill layer 138 is made of organic material including carbon and oxygen, which is made of cross-linked photo-sensitive material. In some embodiments, the fill layer 138 is formed by spin-on coating process, a CVD process (such as LPCVD, PECVD, HDP-CVD, HARP or FCVD), another suitable method, or a combination thereof. The fill layer 138 has a different etching selectivity than the second dielectric mask layer 136, in accordance with some embodiments. In some embodiments, the fill layer 138 has a thickness T3 in a range from about 700 Å to about 1100 Å, measured from the bottom of the source/drain recesses 128A/128B.

A tri-layer mask structure is formed over the fill layer 138, in accordance with some embodiments. The tri-layer mask structure includes a third dielectric mask layer 140 as a bottom layer, a BARC layer 142 as a middle layer, and a top photoresist mask 144, as shown in FIGS. 2H-1 and 2H-2, in accordance with some embodiments. The third dielectric mask layer 140 is formed over the fill layer 138, in accordance with some embodiments. In some embodiments, the third dielectric mask layer 140 is made of a silicon-free dielectric material. In some embodiments, the third dielectric mask layer 140 is made of oxide of amphoteric metal, such as zinc oxide (ZnO), aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$), and/or a combination thereof. In some embodiments, the third dielectric mask layer 140 is deposited using ALD, CVD (such as LPCVD, PECVD, HDP-CVD, HARP, and FCVD), PVD, another suitable method, or a combination thereof.

In some embodiments, the third dielectric mask layer 140 is made of a high-k dielectric material, e.g., having k-value greater than about 7. In some embodiments, the third dielectric mask layer 140 is made of the same material as the second dielectric mask layer 136. In an embodiment, the third dielectric mask layer 140 is made of aluminum oxide ($Al_2O_3$). The third dielectric mask layer 140 has a different etching selectivity than the underlying fill layer 138 and overlying BARC layer 142, in accordance with some embodiments. In some embodiments, the third dielectric mask layer 140 has a thickness T4 in a range from about 30 Å to about 70 Å. In some embodiments, the thickness T4 of the third dielectric mask layer 140 is greater than the thickness T1 of the first dielectric mask layer 134 and the thickness T2 of the second dielectric mask layer 136.

The BARC layer 142 is formed over the fill layer 138, in accordance with some embodiments. The BARC layer 142 may be similar to or the same as the BARC material described above. In some embodiments, the BARC layer 142 has a thickness T5 in a range from about 150 Å to about 250 Å. In some embodiments, the thickness T5 of the BARC layer 142 is greater than the thickness T3 of the third dielectric mask layer 140.

The top photoresist mask 144 is formed over the BARC layer 142, in accordance with some embodiments. In some embodiments, the top photoresist mask 144 covers the second device region 50B of the substrate 102 and uncovered the first device region 50A, in accordance with some embodiments. In some embodiments, the top photoresist mask 144 has a thickness T6 in a range from about 700 Å to about 900 Å. In some embodiments, the thickness T6 of the top photoresist mask 144 is greater than the thickness T5 of the BARC layer 142.

The top photoresist mask 144 is formed by a photolithography process, in accordance with some embodiments. The photolithography process can include forming a photoresist layer over the BARC layer 142 (for example, by spin coating), performing a pre-exposure baking process, performing an exposure process using a mask (or a reticle), performing a post-exposure baking process, and performing a developing process. During the exposure process, the photoresist layer is exposed to radiation energy (such as ultraviolet (UV) light, deep UV (DUV) light, or extreme UV (EUV) light), where the mask blocks, transmits, and/or reflects radiation to the photoresist layer depending on a mask pattern of the mask and/or mask type, such that an image is projected onto the photoresist layer that corresponds with the mask pattern. Since the photoresist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned photoresist layer forms the top photoresist mask 144 which includes a resist pattern that corresponds with the mask.

FIGS. 2I-1 and 2I-2 are cross-sectional views of a semiconductor structure 100 after one or more etching process, in accordance with some embodiments.

One or more etching process is performed using the top photoresist mask 144 to remove portions of the BARC layer 142, the third dielectric mask layer 140 and the fill layer 138 in the first device region 50A of the substrate 102, thereby exposing the second dielectric mask layer 136 in the first regions 50A, as shown in FIGS. 2I-1 and 2I-2, in accordance with some embodiments. After the one or more etching process, a portion of the third dielectric mask layer 140 in the second device region 50B is exposed, in accordance with some embodiments.

For example, a first etching process may be performed to remove a portion of the BARC layer 142 in the first device region 50A until the third dielectric mask layer 140, which may be used as an etching stop layer in the first etching process, is exposed. In some embodiments, the first etching process may be an anisotropic etching process such as dry plasma etching, an isotropic etching process such as dry chemical etching, remote plasma etching or wet chemical etching, an ashing process, and/or a combination thereof. After the first etching process, the top photoresist mask 144 in the second device region 50B may be entirely consumed, or alternatively removed by an additional ashing process, thereby exposing a portion of the BARC layer 142 in the second device region 50B, which may be used as an etching mask for a subsequent etching process.

A second etching process may be then performed to remove a portion of the third dielectric mask layer 140 in the first device region 50A until the fill layer 138, which may be used as an etching stop layer in the second etching process, is exposed. In some embodiments, the second etching process uses a wet etching process using an acidic solution with a pH value of about 3 to about 6.8, or an alkaline solution with a pH value of about 7.2 to about 11. In some embodiments, the second etching process uses Caros solution, including sulfuric acid ($H_2SO_4$) and peroxide ($H_2O_2$). After the second etching process, the BARC layer 142 in the second device region 50B may be removed by an additional etching process or ashing process, thereby exposing a portion of the third dielectric mask layer 140 in the second device region 50B, which may be used as an etching mask for a subsequent etching process.

Afterward, a third etching process may be performed to remove a portion of the fill layer 138 in the first device region 50A until the second dielectric mask layer 136, which may be used as an etching stop layer in the third etching process, is exposed. In some embodiments, the third etching process may be an anisotropic etching process such as dry plasma etching, an isotropic etching process such as dry chemical etching, remote plasma etching or wet chemical etching, an ashing process, and/or a combination thereof. After the third etching process, a portion of the third dielectric mask layer 140 in the second device region 50B may remain substantially unetched and is used as an etching mask in a subsequent etching process.

Figures 1, 2, 2J:
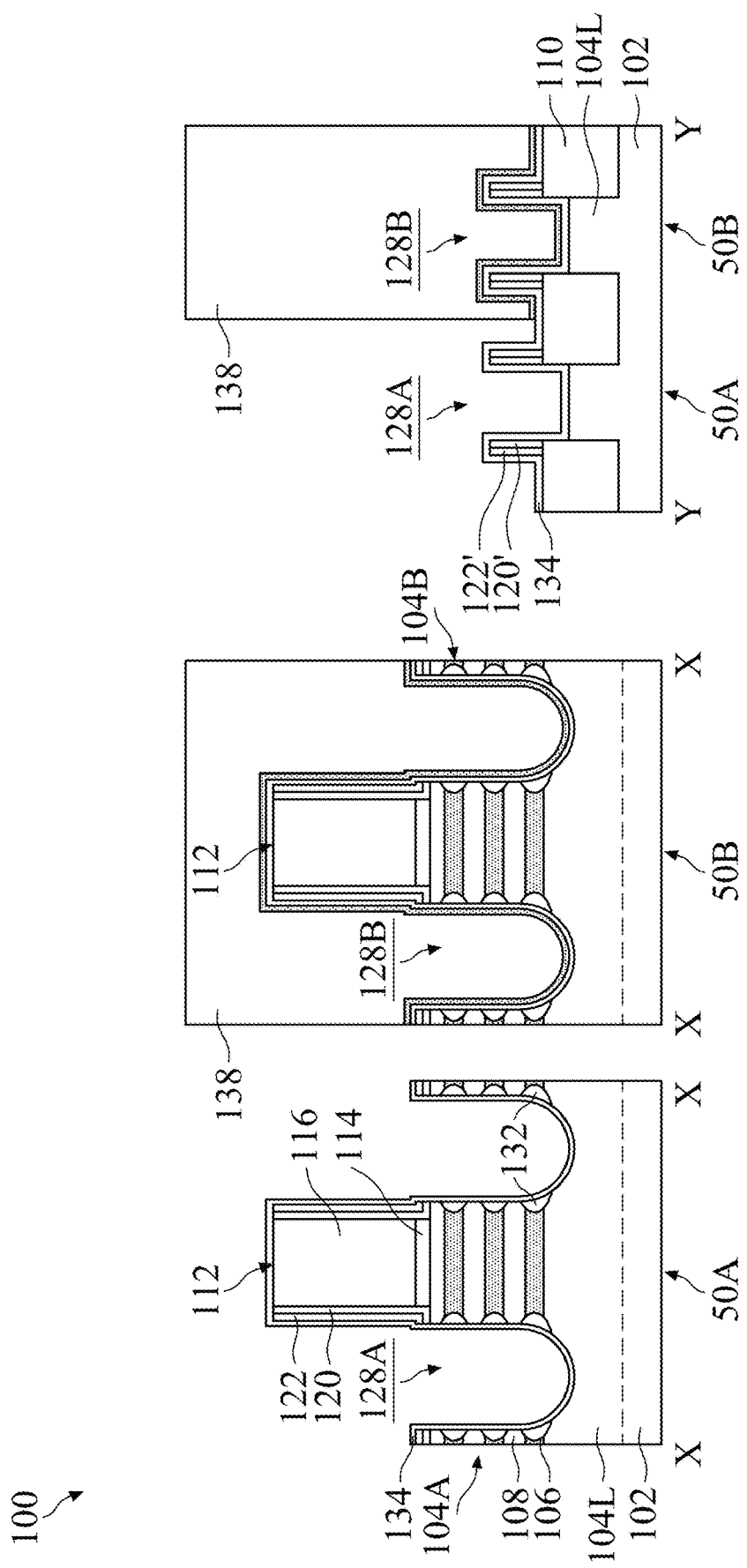

FIGS. 2J-1 and 2J-2 are cross-sectional views of a semiconductor structure 100 the removal of a portion of the second dielectric mask layer 136 in the first device region 50A, in accordance with some embodiments.

An etching process is performed to remove the portion of the second dielectric mask layer 136 in the first device region 50A, thereby exposing a portion of the first dielectric mask layer 134 in the first device region 50A, as shown in FIGS. 2J-1 and 2J-2, in accordance with some embodiments. During the etching process, the third dielectric mask layer 140 in the second device region 50B is also removed, thereby exposing the fill layer 138 in the second device region 50B, in accordance with some embodiment. The source/drain mask structure covers the second device region 50B and partially fills the source/drain recess 128B, in accordance with some embodiments.

In some embodiments, the etching process uses a wet etching process using an acidic solution with a pH value of about 3 to about 6.8, e.g., a dilute hydrogen chloride solution (HCl), a dilute hydrogen fluoride (HF) solution, another suitable solution, and/or a combination thereof. In an embodiment, the dilute hydrogen fluoride solution with the concentration of the HF in a range from about 0.1 vol. % to about 0.3 vol. % is used. In some embodiments, the etching process uses a wet etching process using an alkaline solution with a pH value of about 7.2 to about 11, e.g., a dilute ammonium hydroxide ($NH_4OH$) solution.

FIGS. 2K-1 and 2K-2 are cross-sectional views of a semiconductor structure 100 the removal of a portion of the first dielectric mask layer 134 in the first device region 50A, in accordance with some embodiments.

An etching process is performed to remove the portion of the first dielectric mask layer 134 in the first device region 50A, thereby exposing the source/drain region of the fin structure 104A, the inner spacers 132, the gate spacer layers 122 and 120, the dummy gate electrode layer 116, as shown in FIGS. 2K-1 and 2K-2, in accordance with some embodiments. In some embodiments, the isolation structure 110 and the fin spacer layers 120' and 122' in the first device region 50A are also exposed. Portions of the first dielectric mask layer 134 and the second dielectric mask layer 136 in the second device region 50B are collectively used as a source/drain mask structure, in accordance with some embodiments.

In some embodiments, the etching process uses a wet etching process using an acidic solution with a pH value of about 3 to about 6.8, e.g., a dilute hydrogen chloride solution (HCl) or a dilute hydrogen fluoride (HF) solution. In an embodiment, the dilute hydrogen fluoride solution with the concentration of the HF in a range from about 0.1 vol. % to about 0.3 vol. % is used. In some embodiments, the etching process uses a wet etching process using an alkaline solution with a pH value of about 7.2 to about 11, e.g., a dilute ammonium hydroxide ($NH_4OH$) solution. In some embodiments, the etching process used for removing the second dielectric mask layer 136 and the etching process used for removing the first dielectric mask layer 134 is a single, continuous etching process such that the second dielectric mask layer 136 and the first dielectric mask layer 134 are consecutively removed. In some embodiments, the etching process used for removing the second dielectric mask layer 136 and the etching process used for removing the first dielectric mask layer 134 are separate etching processes.

In some embodiments, the etching process used for removing the first dielectric mask layer 134 includes a main etching step in which most portion of the first dielectric mask layer 134 is removed from the first device region 50A. Once some layers (such as the fin structure 104A, the inner spacers 132, the gate spacer layers 122 and 120, the dummy gate electrode layer 116, the isolation structure 110, and/or the fin spacer layers 120') begin to be exposed from the first dielectric mask layer 134, the main etching step is completed. The time period of the main etching step may be determined by time mode or endpoint mode.

In some embodiments, the etching process used for removing the first dielectric mask layer 134 also includes an over-etching step after the main etching step, in which the remainder of the first dielectric mask layer 134 is partially or entirely removed from the first device region 50A. The time period of the over-etching step may be 5% to about 30% of the time period of the main etching step. In order to avoid excessive loss of low-k materials of the gate spacer layers 122 and 120 and/or the inner spacers 132 during the etching process used for removing the first dielectric mask layer 134, the time period of the over-etching step may be determined by the difference in the etching selectivity between the first dielectric mask layer 134 and the gate spacer layers 122 and 120 (or the inner spacers 132). The loss of low-k materials of the gate spacer layers 122 and 120 and/or the inner spacers 132 may degrade the performance of the resulting semiconductor device (e.g., speed). In some embodiments, the etching process used for removing the first dielectric mask layer 134 does not include an over-etching step, the remainder of the first dielectric mask layer 134 is left on the layers described above.

For example, when the difference in the etching selectivity between the first dielectric mask layer 134 and the gate spacer layers 122 and 120 (or the inner spacers 132) is relatively large, the over-etching step may be performed until the remainder of the first dielectric mask layer 134 is entirely removed. When the difference in the etching selectivity between the first dielectric mask layer 134 and the gate spacer layers 122 and 120 (or the inner spacers 132) is relatively small, a small amount of residue of the first dielectric mask layer 134 may be left on the source/drain region of the fin structure 104A, the inner spacers 132, and/or the gate spacer layers 122 and 120 after the over-etching step.

When a small amount of residue of the first dielectric mask layer 134 is left on the source/drain region of the fin structure 104A, the epitaxial growth of a subsequently formed source/drain feature may not be negatively affected, because the first dielectric mask layer 134 is made of a silicon containing dielectric material (such as SiO). Furthermore, the residue of the first dielectric mask layer 134 left on the gate spacer layers 122 and 120 and/or the inner spacers 132 may not significantly increase the overall capacitance between a subsequently formed source/drain feature and the final gate stack, because the first dielectric mask layer 134 has a relatively low dielectric constant value.

In some cases in which a first dielectric mask layer 134 is not formed, when the residue of the second dielectric mask layer 136, which is made of oxide of amphoteric metal (such as $Al_2O_3$) and having relatively high dielectric constant value, is left on the source/drain region, the epitaxial growth of a subsequently formed source/drain feature may be negatively affected. Furthermore, even if the amount of residue of the second dielectric mask layer 136 left on the gate spacer layers 122 and 120 and/or inner spacers 132 is small, the overall capacitance between subsequently formed source/drain feature and final gate stack may significantly increase, thereby degrading the performance of the resulting semiconductor device (such as speed). However, when an over-etching step is performed to entirely remove the residue of the second dielectric mask layer 136, the loss of low-k materials of the gate spacer layers 122 and 120 and/or the inner spacers 132 may be excessive, which may also degrade the performance of the resulting semiconductor device (such as speed).

The embodiments of the present disclosure use the low-k first dielectric mask layer 134 as the bottom layer of the source/drain mask structure, and therefore the high-k second dielectric mask layer 136 can be substantially entirely removed. Furthermore, the low-k first dielectric mask 134 may provide a good balance between the loss of the low-k spacers and the amount of residue of the source/drain mask structure, thereby enlarging the process window of patterning the source/drain mask structure.

FIGS. 2L-1 and 2L-2 are cross-sectional views of a semiconductor structure 100 the removal of a portion of the fill layer 138 in the second device region 50B, in accordance with some embodiments.

The fill layer 138 is removed from the second device region 50B of the substrate 102 until the second dielectric mask layer 136 is exposed, as shown in FIGS. 2L-1 and 2L-2, in accordance with some embodiments. In some embodiments, the removal process may be an anisotropic etching process such as dry plasma etching, an isotropic etching process such as dry chemical etching, remote plasma etching or wet chemical etching, an ashing process, and/or a combination thereof.

Figures 1, 2, 2M:
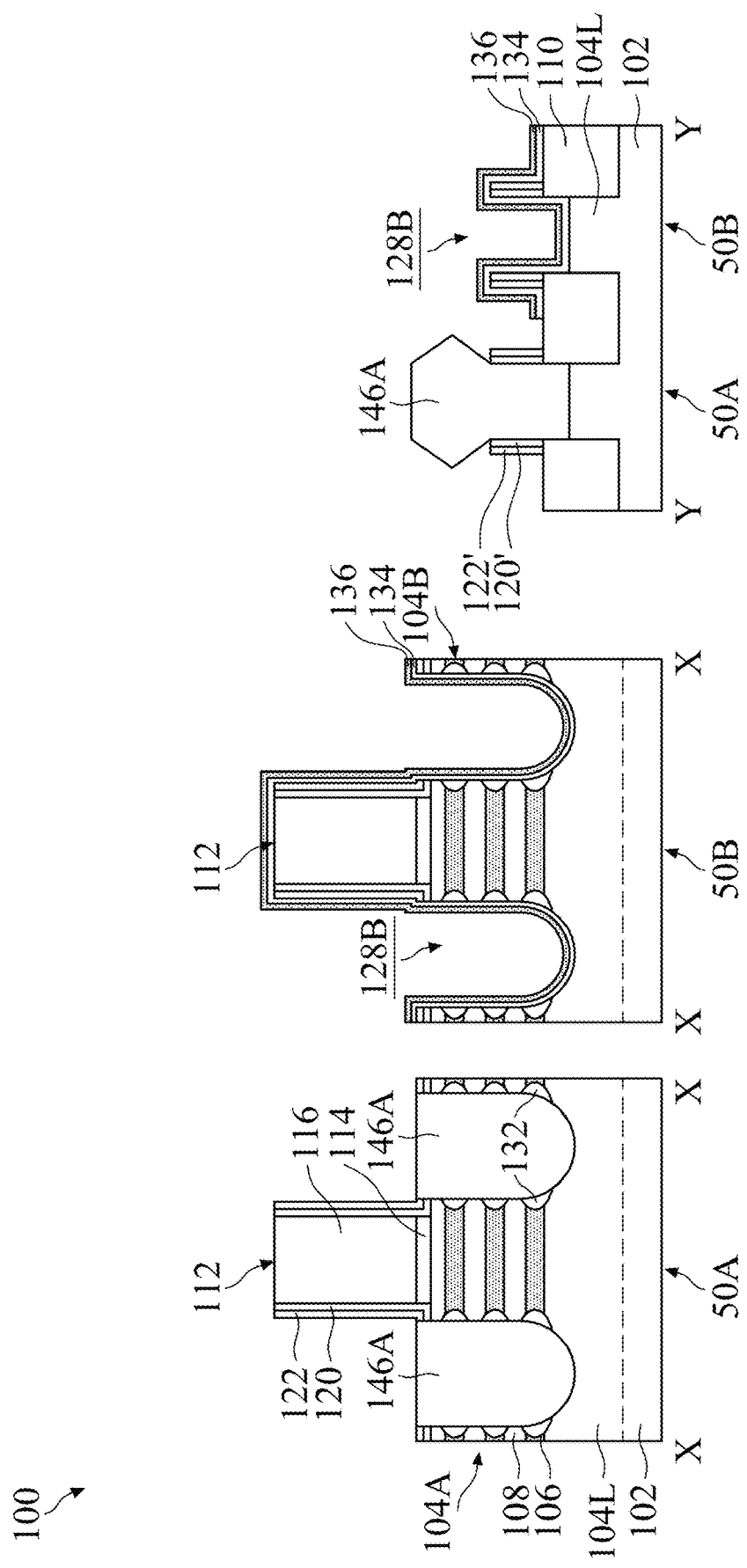

FIGS. 2M-1 and 2M-2 are cross-sectional views of a semiconductor structure 100 after the formation of source/drain features 146A, in accordance with some embodiments.

Source/drain features 146A are formed in the source/drain recesses 128A at first device region 50A of the semiconductor structure 100 using an epitaxial growth process, as shown in FIGS. 2M-1 and 2M-2, in accordance with some embodiments. The epitaxial growth process may be MBE, MOCVD, or VPE, another suitable technique, or a combination thereof. A preclean process may be performed before the epitaxial growth process. For example, a wet clean using dilute ammonium hydroxide solution and/or SiCoNi clean process may be utilized. The source/drain features 146A are grown on the source/drain region of the fin structures 104A, in accordance with some embodiments. The source/drain features 146A abut the second semiconductor layers 108 of the fin structures 104A and the inner spacer layers 132, in accordance with some embodiments.

In some embodiments wherein the fin structure 104A is used to formed as a p-channel nanostructure transistor, the source/drain features 146A are made of semiconductor material such as SiGe, Si, GaAs, another suitable semiconductor material, or a combination thereof. In some embodiments, the source/drain features 146A are doped with a p-type dopant during the epitaxial growth process. For example, the p-type dopant may be boron (B) or $BF_2$. For example, the source/drain features 146A may be the epitaxially grown SiGe doped with boron (B) to form silicon germanium:boron (SiGe:B) source/drain feature.

The second dielectric mask layer 136 of the source/drain mask structure may sufficiently prevent the epitaxial semiconductor material from being grown on the dielectric surface of the second dielectric mask layer 136 during the epitaxial growth process of source/drain features 146A, in accordance with some embodiments. As such, the source/drain mask structure can be easily removed in a following process.

The growth of the source/drain features 146A is initially confined by the fin spacer layers 120' and 122' such that the source/drain features 146A has a narrow bottom portion, in accordance with some embodiments. Once source/drain features 146A grow to protrude from the fin spacer layers 120' and 122', the source/drain features 146A may grow to have facet surfaces that have specific crystalline orientations such that the source/drain features 146A has a wider upper portion. Although the source/drain features 146A are illustrated as having the facet surfaces, the source/drain features 146A may have a curved surface in some other embodiments.

FIGS. 2N-1 and 2N-2 are cross-sectional views of a semiconductor structure 100 the removal of portions of the second dielectric mask layer 136 and the first dielectric mask layer 134 in the second device region 50B, in accordance with some embodiments.

The second dielectric mask layer 136 and the first dielectric mask layer 134 are removed from the second device region 50B of the substrate 102, thereby exposing the source/drain region of the fin structure 104B, the inner spacers 132, the gate spacer layers 122 and 120, and the dummy gate electrode layer 116, as shown in FIGS. 2N-1 and 2N-2, in accordance with some embodiments. In some embodiments, the isolation structure 110 and the fin spacer layers 120' and 122' in the second device region 50B are also exposed.

In some embodiments, the removal process of the second dielectric mask layer 136 and the first dielectric mask layer 134 may be an etching process using Caros solution, including sulfuric acid ($H_2SO_4$) and peroxide ($H_2O_2$). In some embodiments, the removal process of the second dielectric mask layer 136 may be an etching process which may be similar to or the same as that described above with respect to FIGS. 2J-1 and 2J-2. In some embodiments, the removal process of the first dielectric mask layer 134 may be an etching process which may be similar to or the same as that described above with respect to FIGS. 2K-1 and 2K-2. During the etching process, the loss of the epitaxial semiconductor material of the source/drain features 146A is low, due to a large difference in the etching selectivity between the dielectric mask layers 134 and 136 and the source/drain features 146A.

Similarly, when the small amount of residue of the first dielectric mask layer 134 is left on the source/drain region of the fin structure 104B, the epitaxial growth of a subsequently formed source/drain feature may not be negatively affected. Furthermore, the residue of the first dielectric mask layer 134 left on the gate spacer layers 122 and 120 and/or the inner spacers 132 may not significantly increase the overall capacitance between a subsequently formed source/drain feature and the final gate stack.

Figures 1, 2, 2O:
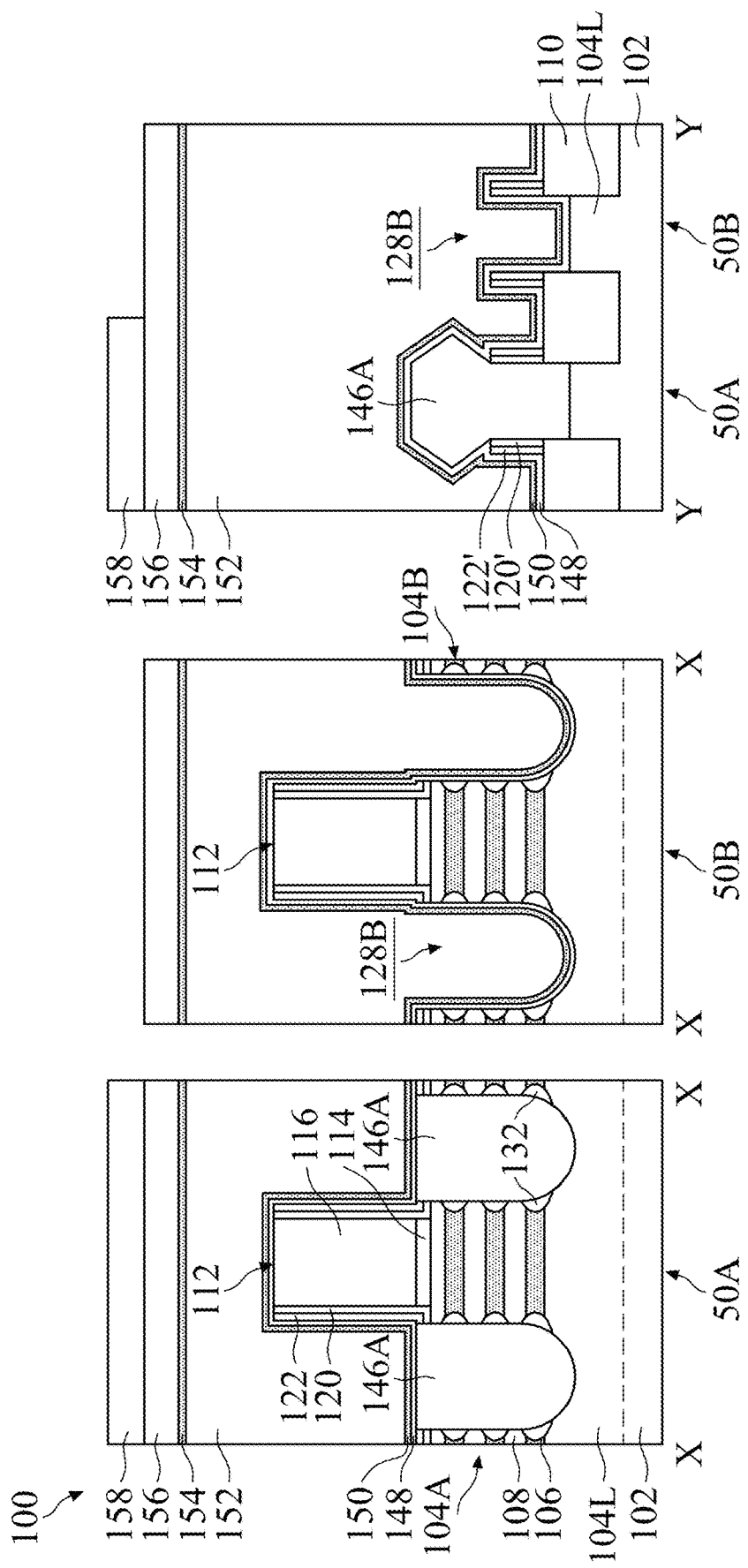

FIGS. 2O-1 through 2P-2 illustrate the formation of a source/drain mask structure for the first device region 50A. The source/drain mask structure for the first device region 50A may be formed using a similar method to the method for forming the source/drain mask structure for the second device region 50B described above in FIGS. 2G-1 through 2L-1. FIGS. 2O-1 and 2O-2 are cross-sectional views of a semiconductor structure 100 after the formation of a tri-layer mask structure, in accordance with some embodiments.

A fourth dielectric mask layer 148, a fifth dielectric mask layer 150, a fill layer 152, and a tri-layer mask structure are sequentially formed over the semiconductor structure 100, as shown in FIGS. 2O-1 and 2O-2, in accordance with some embodiments. The tri-layer mask structure includes a sixth dielectric mask layer 154 as a bottom layer, a BARC layer 156 as a middle layer, and a top photoresist mask 158, in accordance with some embodiments. In some embodiments, the top photoresist mask 158 covers the first device region 50A of the substrate 102 and uncovered the second device region 50B, in accordance with some embodiments.

The materials and the formation methods of the fourth dielectric mask layer 148 and the fifth dielectric mask layer 150 may be similar to or the same as those of the first dielectric mask layer 134 and the second dielectric mask layer 136 described above with respect to FIGS. 2G-1 and 2G-2. The materials and the formation methods of the fill layer 152, the sixth dielectric mask layer 154, the BARC layer 156, and the top photoresist mask 158 may be similar to or the same as the fill layer 138, the third dielectric mask layer 140, the BARC layer 142, and the top photoresist mask 144 described above with respect to FIGS. 2H-1 and 2H-2.

FIGS. 2P-1 and 2P-2 are cross-sectional views of a semiconductor structure 100 after formation of a source/drain mask structure for the first device region 50A, in accordance with some embodiments.

Multiple etching processes are performed on the semiconductor structure 100 using the top photoresist mask 158 to remove the BARC layer 156, the sixth dielectric mask layer 154, the fill layer 152, the fifth dielectric mask layer 150, and the fourth dielectric mask layer 148 from the second device region 50B, thereby exposing the source/drain region of the fin structure 104B, the inner spacers 132, the gate spacer layers 122 and 120, the dummy gate electrode layer 116, as shown in FIGS. 2P-1 and 2P-2, in accordance with some embodiments. In some embodiments, the isolation structure 110 and the fin spacer layers 120' and 122' in the second device region 50B are also exposed.

The etching processes of removing the BARC layer 156, the sixth dielectric mask layer 154 and the fill layer 152 may be similar to or the same as the etching processes described above with respect to FIGS. 2I-1 through 2I-2. The etching process used for removing the fifth dielectric mask layer 150 may be similar to or the same as the etching processes described above with respect to FIGS. 2J-1 through 2J-2. The etching process used for removing the fourth dielectric mask layer 148 may be similar to or the same as the etching processes described above with respect to FIGS. 2K-1 through 2K-2.

Afterward, the fill layer 152 is removed from the first device region 50B, in accordance with some embodiments. The etching process used for removing the fill layer 152 may be similar to or the same as the etching processes described above with respect to FIGS. 2L-1 through 2L-2.

Similarly, after the etching process used for removing the fourth dielectric mask layer 148, if the small amount of residue of the fourth dielectric mask layer 148 is left on the source/drain region of the fin structure 104B, the epitaxial growth of a subsequently formed source/drain feature may not be negatively affected, because the fourth dielectric mask layer 148 is made of a silicon containing dielectric material (such as SiO). Furthermore, the residue of the fourth dielectric mask layer 148 left on the gate spacer layers 122 and 120 and/or the inner spacers 132 may not significantly increase the overall capacitance between a subsequently formed source/drain feature and the final gate stack, because the fourth dielectric mask layer 148 has a relatively low dielectric constant value.

The embodiments of the present disclosure use the low-k fourth dielectric mask layer 148 as the bottom layer of the source/drain mask structure, and therefore the high-k fifth dielectric mask layer 150 can be substantially entirely removed. Furthermore, the low-k fourth dielectric mask layer 148 may provide a good balance between the loss of the low-k spacers and the amount of residue of the source/drain mask structure, thereby enlarging the process window of patterning the source/drain mask structure.

Figures 1, 2, 2Q:
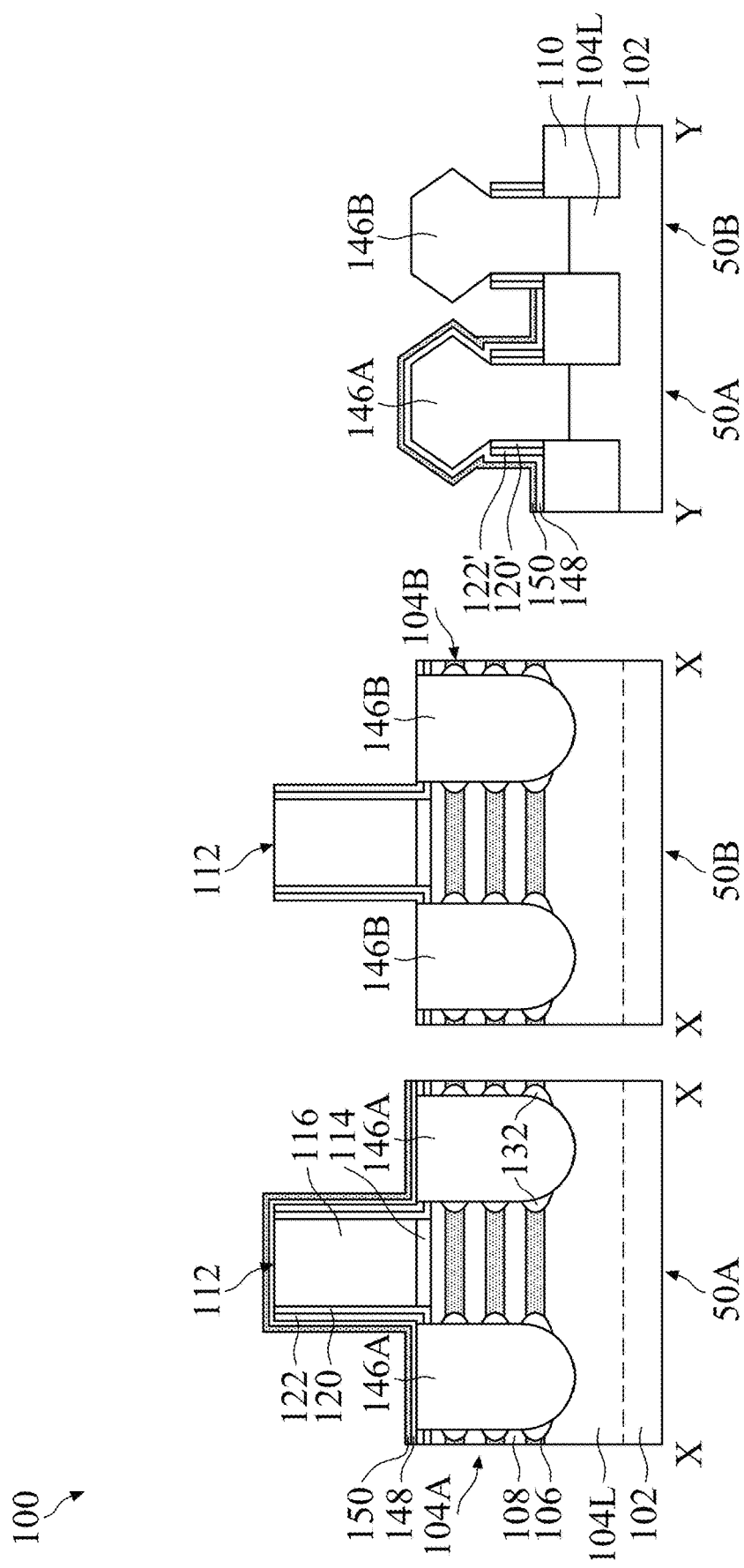

FIGS. 2Q-1 and 2Q-2 are cross-sectional views of a semiconductor structure 100 after the formation of source/drain features 146B, in accordance with some embodiments.

Source/drain features 146B are formed in the source/drain recesses 128B at second device region 50B of the semiconductor structure 100 using an epitaxial growth process, as shown in FIGS. 2Q-1 and 2Q-2, in accordance with some embodiments. The epitaxial growth process may be MBE, MOCVD, or VPE, another suitable technique, or a combination thereof. A preclean process may be performed before the epitaxial growth process. For example, a wet clean using dilute ammonium hydroxide solution and/or SiCoNi clean process may be utilized. The source/drain features 146B are grown on the source/drain region of the fin structures 104B, in accordance with some embodiments. The source/drain features 146B abut the second semiconductor layers 108 of the fin structures 104B and the inner spacer layers 132, in accordance with some embodiments.

In some embodiments wherein the fin structure 104B is used to formed as an n-channel nanostructure transistor, the source/drain features 146B are made of semiconductor material such as SiP, SiAs, SiCP, SiC, Si, GaAs, another suitable semiconductor material, or a combination thereof. In some embodiments, the source/drain features 146B are doped with an n-type dopant during the epitaxial growth process. For example, the n-type dopant may be phosphorous (P) or arsenic (As). For example, the source/drain features 146B may be the epitaxially grown Si doped with phosphorous to form silicon:phosphor (Si:P) source/drain features and/or arsenic to form silicon:arsenic (Si:As) source/drain feature.

The fifth dielectric mask layer 150 of the source/drain mask structure may sufficiently prevent the epitaxial semiconductor material from being grown on the dielectric surface of the fifth dielectric mask layer 150 during the epitaxial growth process of source/drain features 146B, in accordance with some embodiments. As such, the source/drain mask structure can be easily removed in a following process. The source/drain features 146B has a narrow bottom portion confined between the fin spacer layers 120' and 122' and a wider upper portion having facet surfaces. Although the source/drain features 146B are illustrated as having the facet surfaces, the source/drain features 146A may have a curved surface in some other embodiments.

FIGS. 2R-1 and 2R-2 are cross-sectional views of a semiconductor structure 100 the removal of portions of the fifth dielectric mask layer 150 and the fourth dielectric mask layer 148 in the first device region 50A, in accordance with some embodiments.

The fifth dielectric mask layer 150 and the fourth dielectric mask layer 148 are removed from the first device region 50A of the substrate 102, thereby exposing the source/drain feature 146A, the gate spacer layers 122 and 120, and the dummy gate electrode layer 116, as shown in FIGS. 2R-1 and 2R-2, in accordance with some embodiments. In some embodiments, the isolation structure 110, and the fin spacer layers 120' and 122' in the first device region 50A are also exposed. The removal process may be similar to or the same as that described above with respect to FIGS. 2N-1 and 2N-2. Similarly, when the small amount of residue of the fourth dielectric mask layer 148 is left on the gate spacer layers 122 and 120, the overall capacitance between the source/drain feature 146A and subsequently formed final gate stack may not significantly increase.

FIGS. 2S-1 and 2S-2 are cross-sectional views of a semiconductor structure 100 after the formation of a contact etching stop layer (CESL) 160 and an interlayer dielectric (ILD) layer 162, in accordance with some embodiments.

A contact etching stop layer 160 is formed over the semiconductor structure 100, as shown in FIGS. 2S-1 and 2S-2, in accordance with some embodiments. The contact etching stop layer 160 extends along and covers the surfaces of the wider upper portions of the source/drain features 146A and 146B, the sidewalls of the gate spacer layers 122, the sidewalls and the upper portions of the fin spacers 122', the upper portions of the fin spacers 120', and the upper surface of the isolation structure 110, in accordance with some embodiments. Afterward, an interlayer dielectric layer 162 is formed over the contact etching stop layer 144, as shown in FIGS. 2S-1 and 2S-2, in accordance with some embodiments.

In some embodiments, the contact etching stop layer 160 is made of a dielectric material, such as silicon oxide ($SiO_2$), silicon nitride (SiN), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 160 is globally and conformally deposited over the semiconductor structure 100 using CVD (such as LPCVD, PECVD, HDP-CVD, HARP, and FCVD), ALD, another suitable method, or a combination thereof.

In some embodiments, the interlayer dielectric layer 162 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 162 is made of a different material than the contact etching stop layer 160. In some embodiments, a dielectric material for the interlayer dielectric layer 162 is deposited using such as CVD (such as HDP-CVD, PECVD, HARP or FCVD), another suitable technique, and/or a combination thereof. Afterward, the dielectric materials for the contact etching stop layer 160 and the interlayer dielectric layer 162 above the upper surfaces of the dummy gate electrode layer 116 are removed using such as CMP until the upper surfaces of the dummy gate structure 112 is exposed. In some embodiments, the upper surface of the interlayer dielectric layer 162 is substantially coplanar with the upper surfaces of the dummy gate electrode layers 116.

FIGS. 2T-1 and 2T-2 are cross-sectional views of a semiconductor structure 100 after the formation of a gate trench 164 and gaps 166, in accordance with some embodiments.

The dummy gate structure 112 is removed using an etching process to form a gate trench 164, as shown in FIGS. 2T-1, in accordance with some embodiments. The gate trench 164 exposes the channel regions CH of the fin structures 104A and 104B, in accordance with some embodiments. In some embodiments, the gate trench 164 also exposes the inner sidewalls of the gate spacer layer 120 facing the channel region, in accordance with some embodiments.

In some embodiments, the etching process includes one or more etching processes. For example, when the dummy gate electrode layer 116 is made of polysilicon, a wet etchant such as a tetramethylammonium hydroxide (TMAH) solution may be used to selectively remove the dummy gate electrode layers 116. For example, the dummy gate dielectric layer 114 may be thereafter removed using a plasma dry etching, a dry chemical etching, and/or a wet etching.

The first semiconductor layers 106 of the fin structures 104A and 104B are removed using an etching process to form gaps 166, as shown in FIG. 2T-1, in accordance with some embodiments. The inner spacer layers 132 may be used as an etching stop layer in the etching process, which may protect the source/drain features 146A and 146B from being damaged. The gaps 166 are formed between the neighboring second semiconductor layers 108 and between the lowermost second semiconductor layer 108 and the lower fin elements 104L of the fin structures 104A and 104B, in accordance with some embodiments. In some embodiments, the gaps 166 also expose the inner sidewalls of the inner spacer layers 132 facing the channel region.

After the etching process, the four main surfaces (only upper and bottom surfaces are shown in FIG. 2T-1) of the second semiconductor layers 108 are exposed, in accordance with some embodiments. The exposed second semiconductor layers 108 form nanostructures that function as channel layers of the resulting semiconductor devices (e.g., a nanostructure transistor), in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions. In some embodiments, the inner spacer layers 132 serve an etching stop layer in the etching process.

FIGS. 2U-1 and 2U-2 are cross-sectional views of a semiconductor structure 100 after the formation of a final gate stack 172, in accordance with some embodiments.

A gate dielectric layer 170 is formed on and wraps around the exposed surfaces of the nanostructures 108, as shown in FIG. 2U-1, in accordance with some embodiments. The gate dielectric layer 170 is also formed along and covers the inner sidewalls of the gate spacer layers 120 facing the channel region, in accordance with some embodiments. The gate dielectric layer 170 is also formed along and covers the inner sidewalls of the inner spacer layers 132 facing the channel region, in accordance with some embodiments.

The gate dielectric layer 170 may include an interfacial layer and a high-k dielectric layer formed over the interfacial layer. The interfacial layer may be made of a chemically formed silicon oxide by one or more cleaning processes such as including ozone ($O_3$), ammonia hydroxide-hydrogen peroxide-water mixture, and/or hydrochloric acid-hydrogen peroxide-water mixture. The interfacial layer may be formed by oxidizing outer portions of the nanostructures 108 and formed on the exposed main surfaces of the nanostructures 108, but not formed on the surface of dielectric layers (such as gate spacers and inner spacers). In some embodiments, the high-k dielectric layer is made of a dielectric material with high dielectric constant (k value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

A metal gate electrode layer 172 is formed over the gate dielectric layer 170 and fills remainders of the gate trench 164 and the gaps 166, as shown in FIG. 2U-1, in accordance with some embodiments. The metal gate electrode layer 172 wraps around the nanostructures 108, in accordance with some embodiments. In some embodiments, the metal gate electrode layer 172 is made of more than one conductive material, such as a metal, metal alloy, conductive metal oxide and/or metal nitride, another suitable conductive material, and/or a combination thereof. For example, the metal gate electrode layer 172 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 172 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 172 may be formed using ALD, PVD, CVD, e-beam evaporation, or another suitable process. The metal gate electrode layer 172 may be formed separately for n-channel nanostructure transistors (such as in the second device region 50B) and n-channel nanostructure transistors (such as in the first device region 50A), which may use different work function materials.

A planarization process such as CMP may be performed on the semiconductor structure 100 to remove the materials of the gate dielectric layer 170 and the metal gate electrode layer 172 formed above the upper surface of the interlayer dielectric layer 162, in accordance with some embodiments. After the planarization process, the upper surface of the metal gate electrode layer 172 and the upper surface of the interlayer dielectric layer 162 are substantially coplanar, in accordance with some embodiments.

The gate dielectric layer 170 and the metal gate electrode layer 172 combine to form a final gate stack 168, in accordance with some embodiments. In some embodiments, the final gate stack 168 extends in Y direction. That is, the final gate stack 168 has longitudinal axes parallel to Y direction, in accordance with some embodiments. The final gate stack 168 wraps around each of the nanostructures 108 and interposes between the source/drain features 146A and between the source/drain feature 146B, in accordance with some embodiments.

In the first device region 50A, the final gate stack 168 combines with the source/drain features 146A to form a nanostructure transistor, such as a p-channel nanostructure transistor, in accordance with some embodiments. In the second device region 50B, the final gate stack 168 combines with the source/drain features 146B to form a nanostructure transistor, such as an n-channel nanostructure transistor, in accordance with some embodiments. The final gate stack 168 may engage the channel region of the nanostructures 108, such that current can flow between the source/drain feature 146A and between the source/drain feature 146B during operation.

It is understood that the semiconductor structure 100 may undergo further CMOS processes to form various features over the semiconductor structure 100, such as a multilayer interconnect structure (e.g., contacts to gate and/or source/drain features, vias, lines, inter metal dielectric layers, passivation layers, etc.).

The embodiments of the present disclosure use a bi-layered source/drain mask structure that includes a silicon-containing dielectric mask layer (such as the first dielectric mask layer 134 and the fourth dielectric mask layer 148) and a high-k dielectric mask layer (such as the second dielectric mask layer 136 and the fifth dielectric mask layer 150) over the silicon-containing dielectric mask layer. A good balance between the loss of the low-k spacers and the amount of residue of the source/drain mask structure may be provided, thereby enlarging the process window of patterning the source/drain mask structure. As a result, the yield and the performance of the resulting semiconductor device may be improved.

FIGS. 3A through 3G are cross-sectional views illustrating the formation of a semiconductor structure at various intermediate stages corresponding to cross-section X-X shown in FIG. 1, in accordance with some embodiments. The embodiments of FIGS. 3A through 3G are similar to that shown in FIGS. 2A-1 through 2U-2 except that the first dielectric mask layer 134 is left within the inner spacers 132.

Figure 3A:
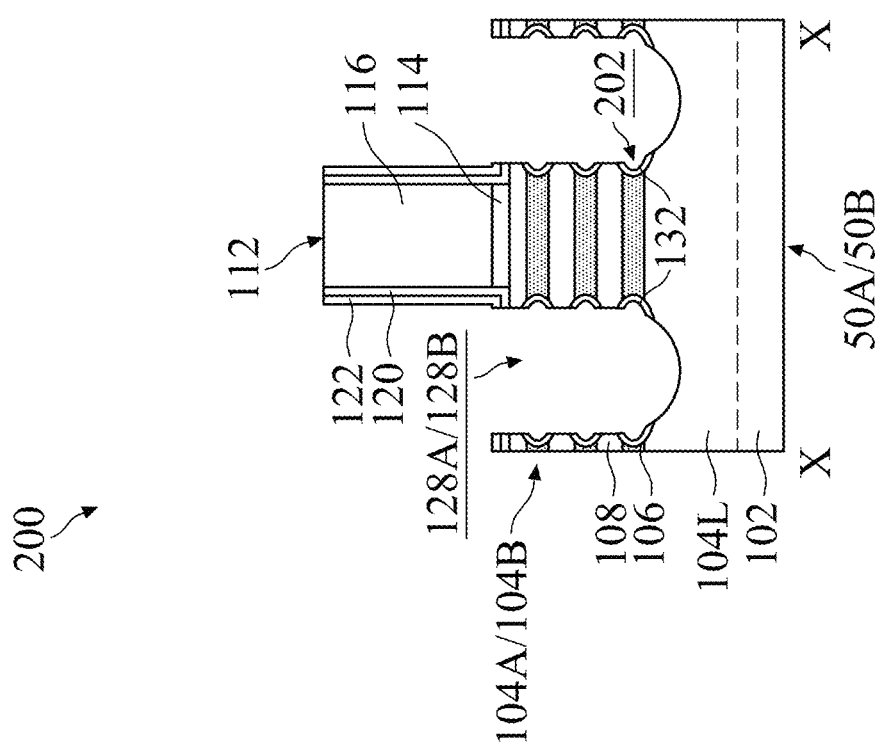
FIGS. 3A through 3G are cross-sectional views illustrating the formation of a semiconductor structure at various intermediate stages, in accordance with some embodiments of the disclosure.

FIG. 3A illustrates a cross-sectional view of a semiconductor structure 200 which has been subjected the steps described above respect to FIGS. 2A-1 through 2F-2, in accordance with some embodiments.

Fin structures 104A and 104B are formed over the substrate 102, and an isolation structure 110 (FIG. 2A-2) are is formed to surround the lower fin elements 104L of the fin structures 104A and 104B, in accordance with some embodiments. A dummy gate structure 112 is formed across and surrounds the channel region of the fin structures 104A and 104B, and gate spacer layers 120 and 122 are sequentially formed over the semiconductor structure 200, in accordance with some embodiments. One or more etching process is performed to removes horizontal portions of the gate spacer layers 120 and 122 and recess the source/drain regions of the fin structures 104A and 104B, thereby forming source/drain recesses 128A in the first device region 50A and source/drain recesses 128B in the second device region 50B, in accordance with some embodiments. An etching process is performed on the semiconductor structure 200 to laterally recess, from the source/drain recesses 128A and 128B, the first semiconductor layers 106 of the fin structures 104A and 104B to form notches 130, and inner spacer layers 132 are formed in the notches 130 to abut the first semiconductor layers 106 of the fin structures 104A and 104B, in accordance with some embodiments. Due to the conformal deposition of the inner spacer layers 132, seams 202 are formed within the inner spacer layers 132, as shown in FIG. 3A, in accordance with some embodiments.

Figure 3B:
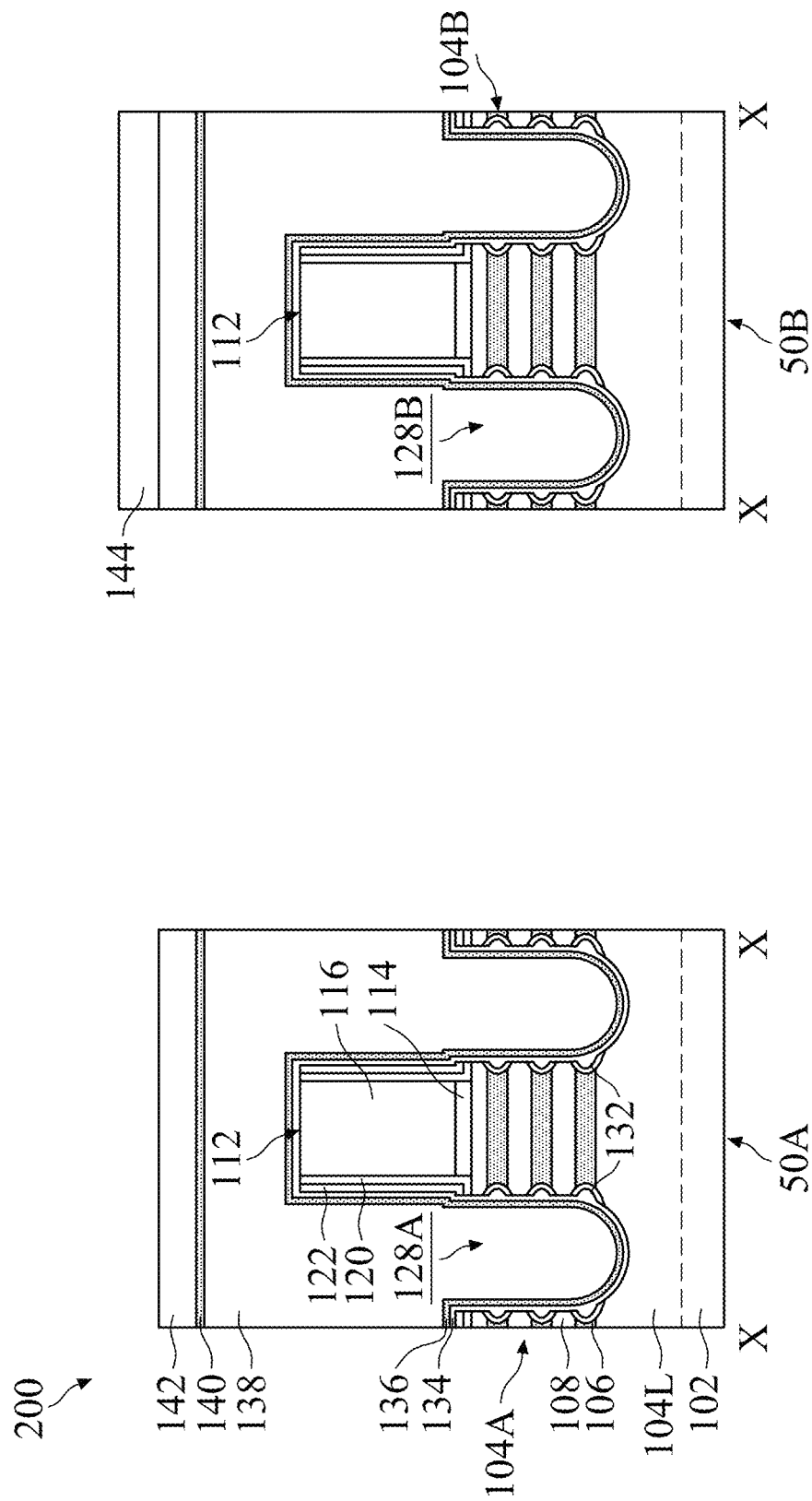

FIG. 3B illustrates a cross-sectional view of a semiconductor structure 200 which has been subjected the steps described above respect to FIGS. 2G-1 through 2H-2, in accordance with some embodiments.

A first dielectric mask layer 134, the second dielectric mask layer 136, a fill layer 138, and a tri-layer mask structure including a third dielectric mask layer 140, a BARC layer 142, and a top photoresist mask 144 are formed over the semiconductor structure 200, in accordance with some embodiments. The first dielectric mask layer 134 is formed to fill the seams 202, as shown in FIG. 3B, in accordance with some embodiments.

Figure 3C:
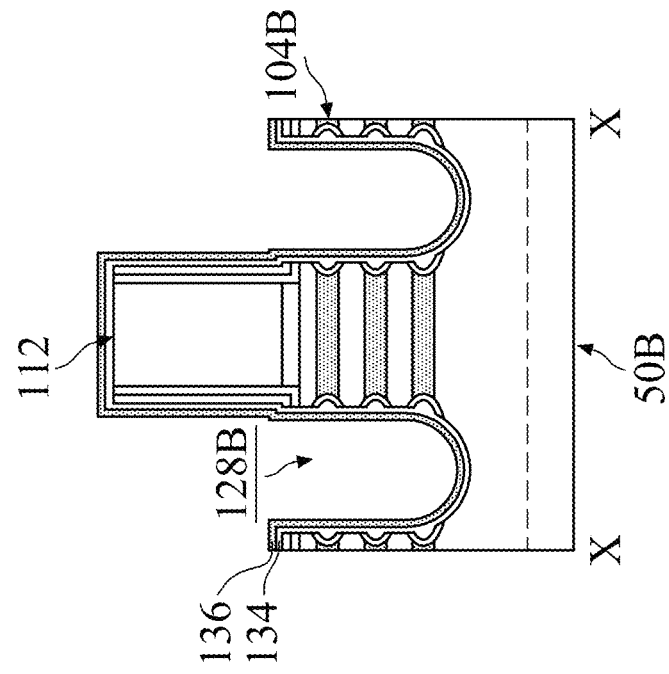
Figure 3C:
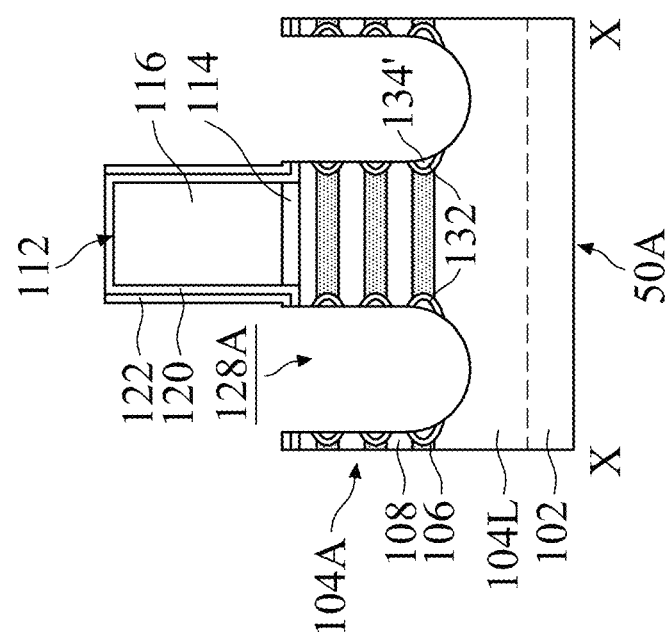

FIG. 3C illustrates a cross-sectional view of a semiconductor structure 200 which has been subjected the steps described above respect to FIGS. 2I-1 through 2L-2, in accordance with some embodiments.

One or more etching process is performed using the top photoresist mask 144 to remove portions of the BARC layer 142, the third dielectric mask layer 140, the fill layer 138, the second dielectric mask layer 136, and the first dielectric mask layer 134 in the first device region 50A of the substrate 102, thereby exposing the source/drain region of the fin structure 104A, in accordance with some embodiments. After the etching process (FIGS. 2K-1 and 2K-2) of removing the first dielectric mask layer 134, the portion of the first dielectric mask layer 134 filling the seams 202 is left within the inner spacer 132 and are denoted as 134', in accordance with some embodiments. The remaining portions 134' of the first dielectric mask layer 134 may serve as a part of the inner spacers.

Figure 3D:
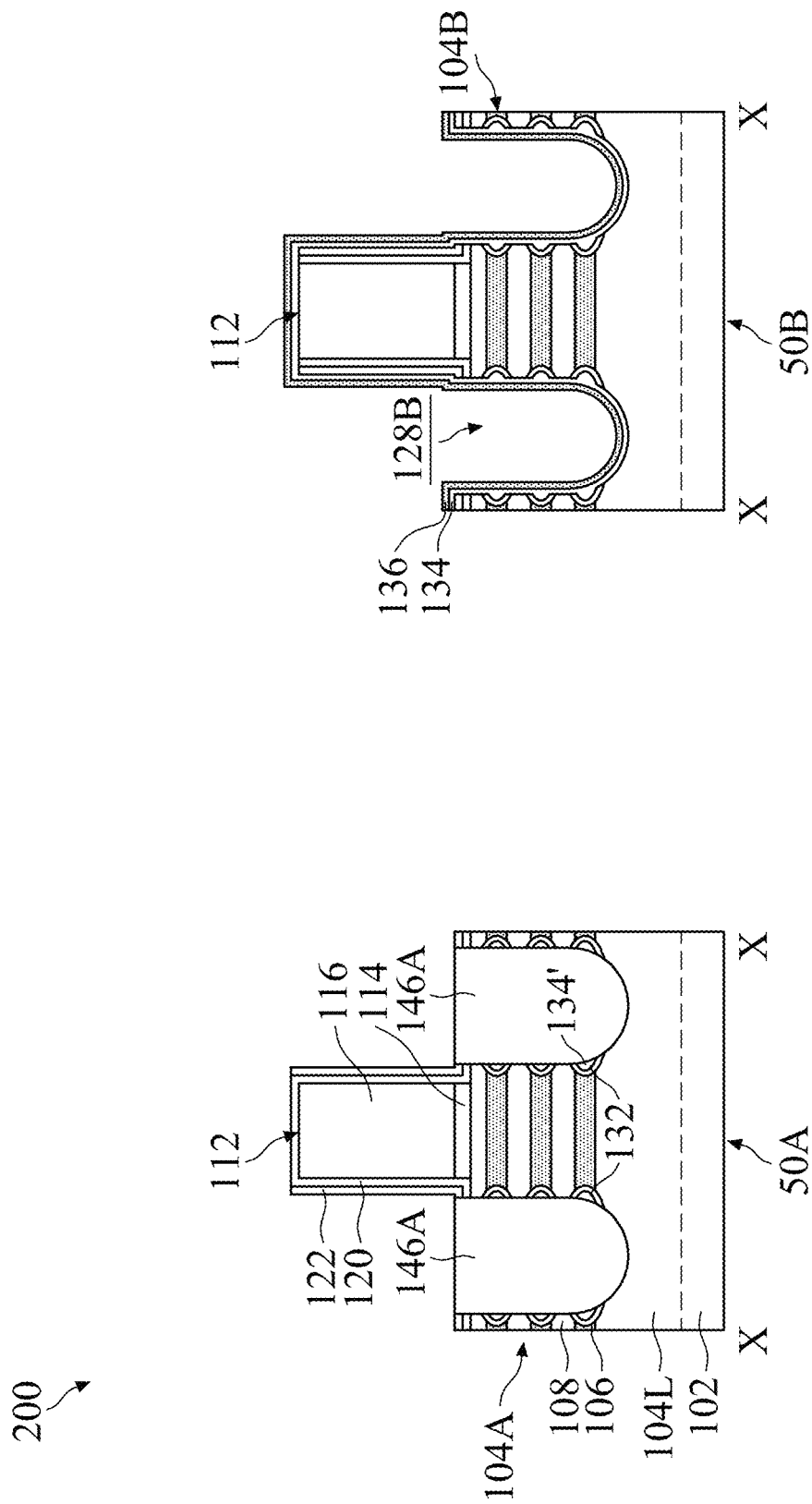

FIG. 3D illustrates a cross-sectional view of a semiconductor structure 200 which has been subjected the steps described above respect to FIGS. 2M-1 through 2M-2, in accordance with some embodiments.

Source/drain features 146A are formed in the source/drain recesses 128A at first device region 50A of the semiconductor structure 200 using an epitaxial growth process, in accordance with some embodiments.

Figure 3E:
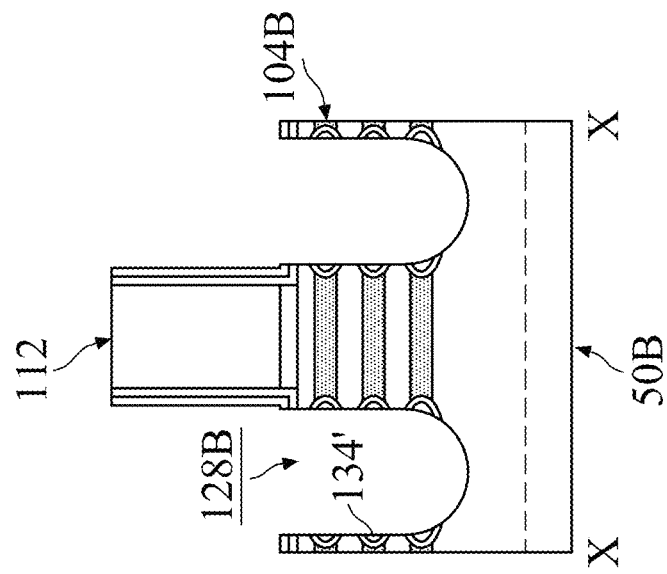
Figure 3E:
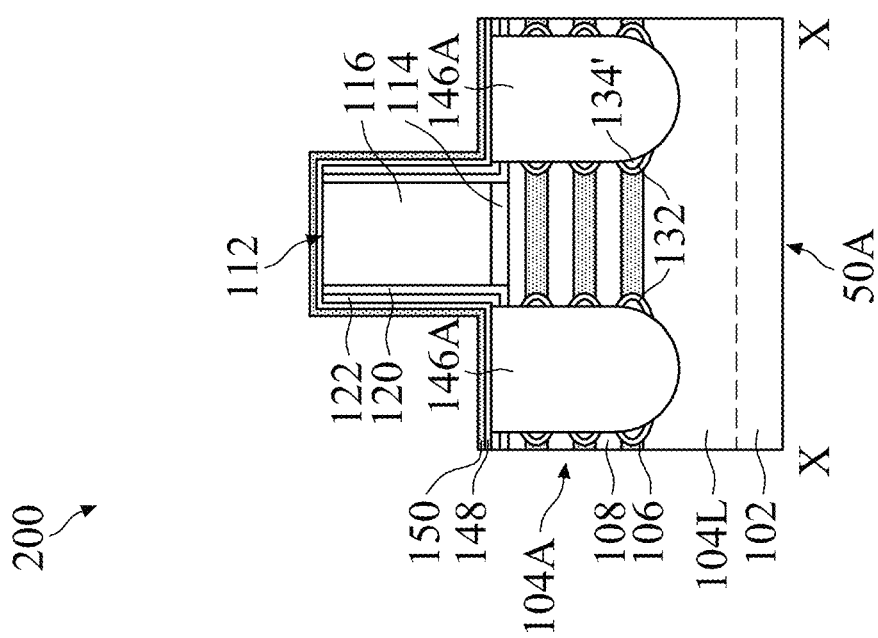

FIG. 3E illustrates a cross-sectional view of a semiconductor structure 200 which has been subjected the steps described above respect to FIGS. 2N-1 through 2P-2, in accordance with some embodiments.

The mask structure for the second device region 50B is removed, in accordance with some embodiments. After the etching process (FIGS. 2N-1 and 2N-2) of removing the first dielectric mask layer 134, the portion of the first dielectric mask layer 134 filling the seams 202 is left within the inner spacer 132 and are denoted as 134', in accordance with some embodiments. The remaining portions 134' of the first dielectric mask layer 134 may serve as a part of the inner spacers.

A fourth dielectric mask layer 148, the fifth dielectric mask layer 150, a fill layer 152 (FIG. 2O-1), and a tri-layer mask structure (FIG. 2O-1) including a sixth dielectric mask layer 154, a BARC layer 156, and a top photoresist mask 158 are formed over the semiconductor structure 200, in accordance with some embodiments. One or more etching process is performed using the top photoresist mask 158 to remove portions of the BARC layer 156, the sixth dielectric mask layer 154, the fill layer 152, the fifth dielectric mask layer 150 and the fourth dielectric mask layer 148 in the second device region 50B of the substrate 102, thereby exposing the source/drain region of the fin structure 104B, in accordance with some embodiments.

Figure 3F:
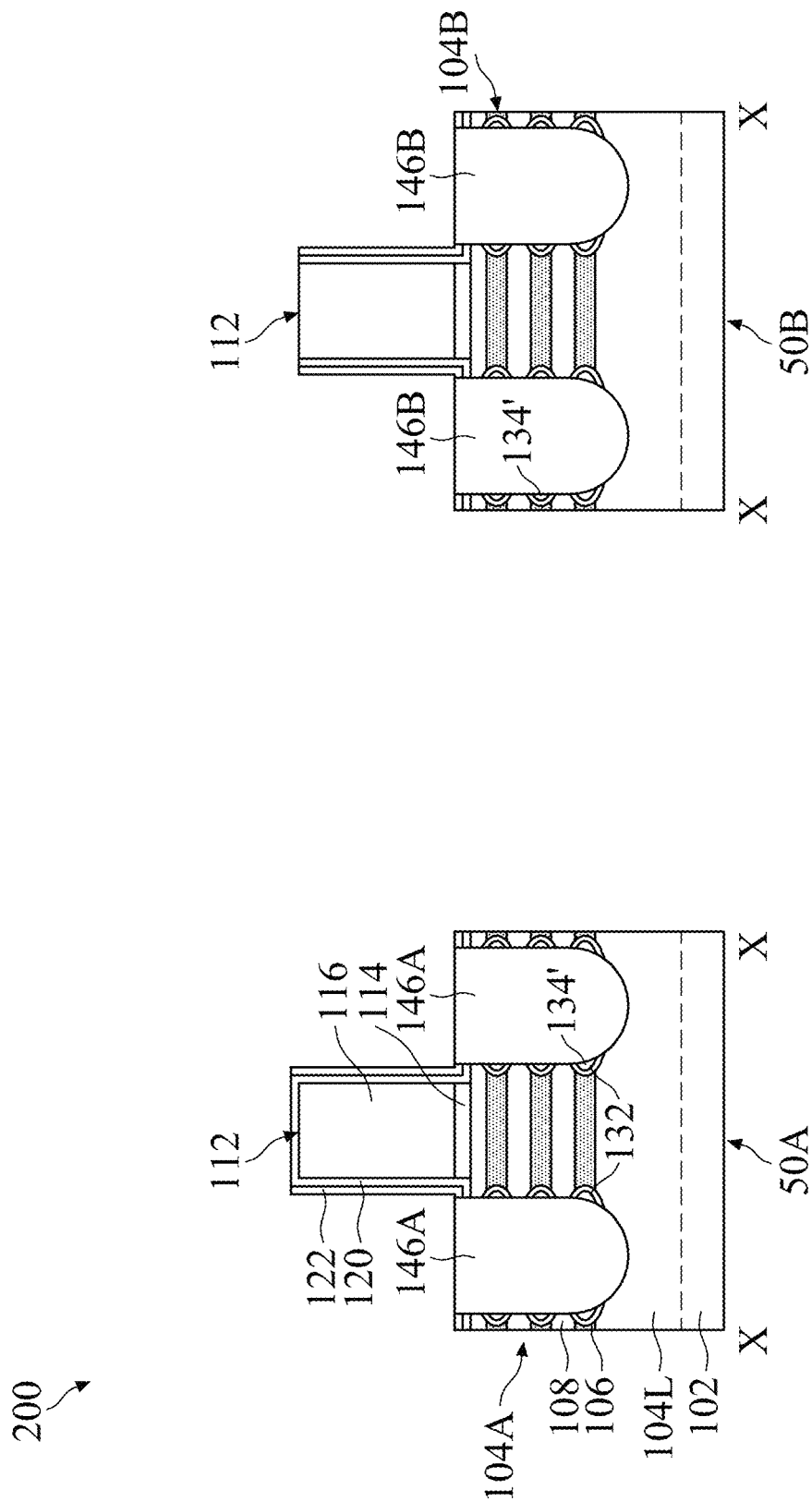

FIG. 3F illustrates a cross-sectional view of a semiconductor structure 200 which has been subjected the steps described above respect to FIGS. 2Q-1 through 2R-2, in accordance with some embodiments.

Source/drain features 146B are formed in the source/drain recesses 128B at second device region 50B of the semiconductor structure 200 using an epitaxial growth process, in accordance with some embodiments. The mask structure for the first device region 50A is removed, in accordance with some embodiments.

Figure 3G:
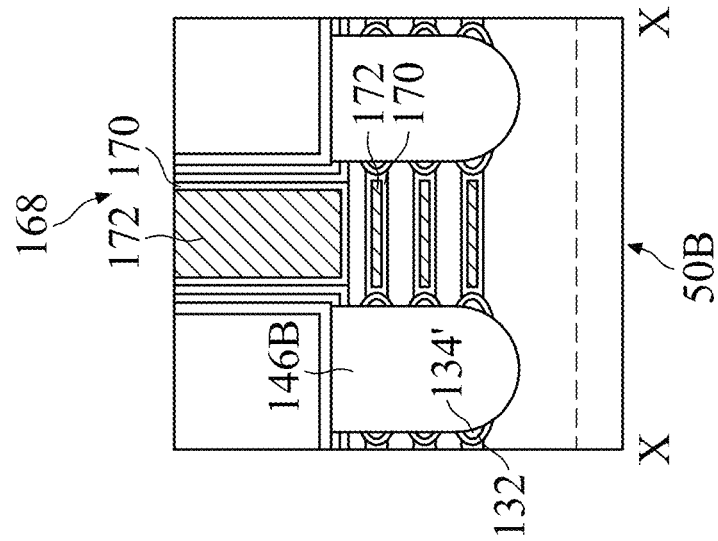
Figure 3G:
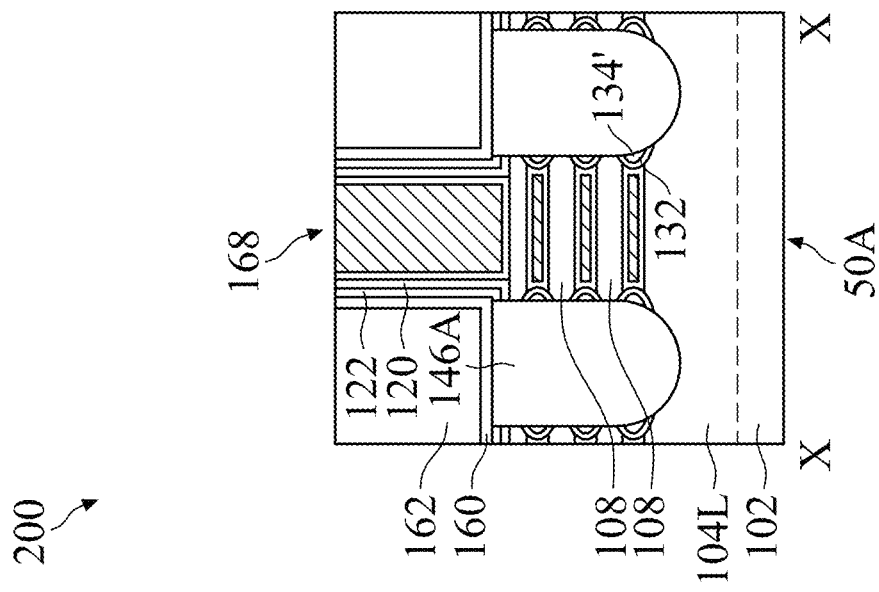

FIG. 3G illustrates a cross-sectional view of a semiconductor structure 200 which has been subjected the steps described above respect to FIGS. 2S-1 through 2U-2, in accordance with some embodiments.

A contact etching stop layer 160 and an interlayer dielectric layer 162 are sequentially formed over the semiconductor structure 200, in accordance with some embodiments. The dummy gate structure 112 is removed using an etching process to form a gate trench 164 (FIG. 2T-1), in accordance with some embodiments. The first semiconductor layers 106 of the fin structures 104A and 104B are removed using an etching process to form gaps 166 (FIG. 2T-1), in accordance with some embodiments. A final gate structure 168 is formed to wraps around each of the nanostructures 108 (the second semiconductor layers 108 of the fin structure 104A), in accordance with some embodiments.

The remaining portions 134' of the first dielectric mask layer 134 are left on the inner spacers 132 may not negatively affect the epitaxial growth of the source/drain feature. Furthermore, the overall capacitance between the source/drain features and final gate stack may not significantly increase. In addition, because the remaining portions 134' of the first dielectric mask layer 134 fills the seams 202, the inner spacers 132 (and 134') may be more robust to resist the etching process used for forming the gaps 166 (FIG. 2U-1). As a result, the yield and the performance of the resulting semiconductor device may be improved.

Figure 4:
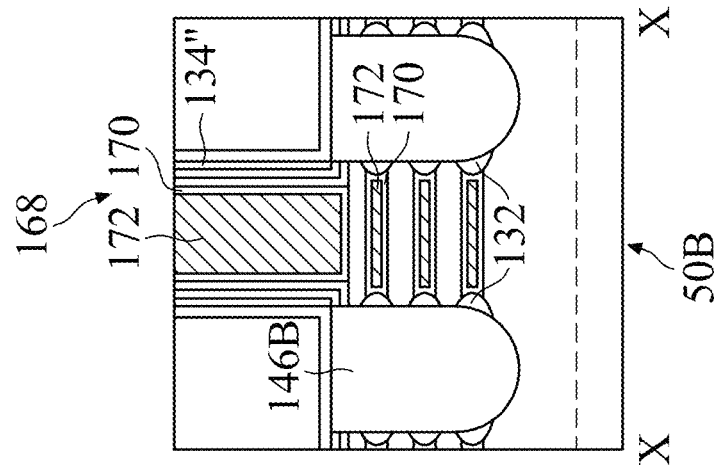
FIG. 4 is a cross-sectional view illustrating a semiconductor structure, in accordance with some embodiments of the disclosure.
Figure 4:
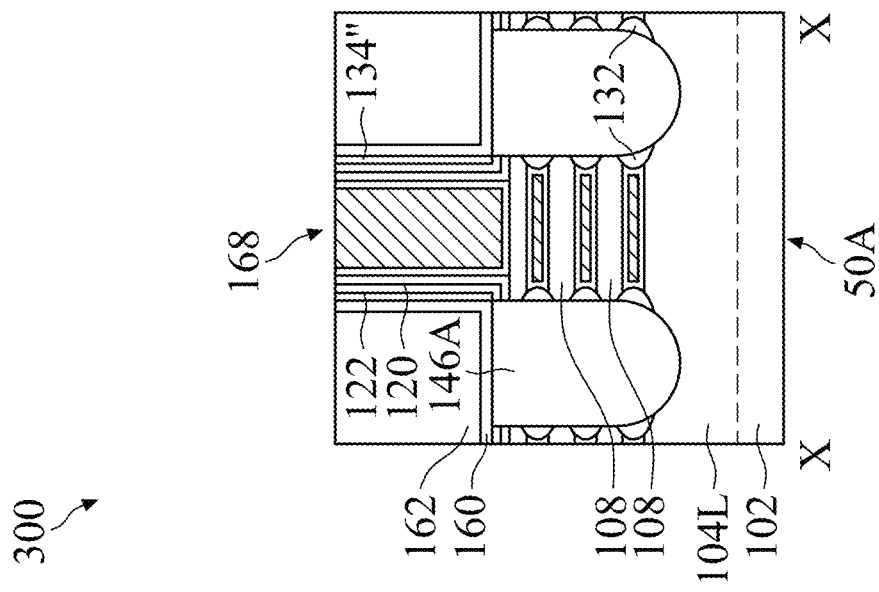

FIG. 4 is a cross-sectional view illustrating a semiconductor structure 400, in accordance with some embodiments. The semiconductor structure 400 shown FIG. 4 is similar to the semiconductor structure 100 shown in FIG. 2U-1 except that the first dielectric mask layer 134 is left on the gate spacer layer 122.

After the etching process (FIGS. 2K-1 and 2K-2) of removing the first dielectric mask layer 134 from the first device region 50A, a portion of the first dielectric mask layer 134 is left on the gate spacer 122 in the first device region 50A, in accordance with some embodiments. And, after the etching process (FIGS. 2N-1 and 2N-2) of removing the first dielectric mask layer 134 from the second device region 50B, a portion of the first dielectric mask layer 134 is left on the gate spacer 122 in the second device region 50B, in accordance with some embodiments. The remaining portions of the first dielectric mask layer 134 may serve as a part of the gate spacer layers and are denoted as 134".

The remaining portions 134" of the first dielectric mask layer 134 left on the gate spacers 122 may not negatively affect the epitaxial growth of the source/drain feature. Furthermore, the overall capacitance between the source/drain features and final gate stack may not significantly increase.

Figures 2, 5A:
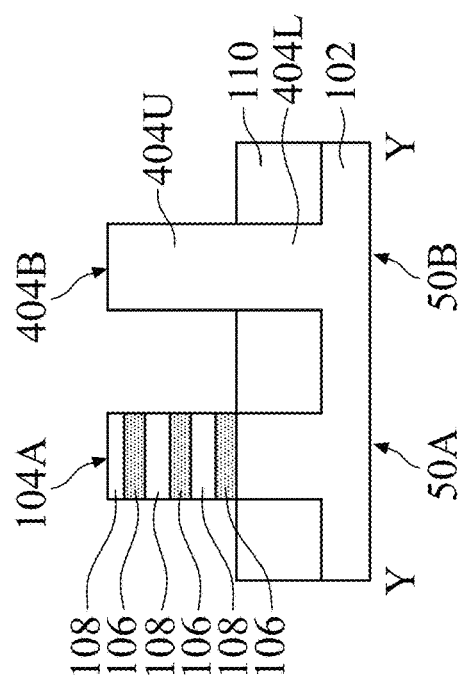
Figures 1, 5A:
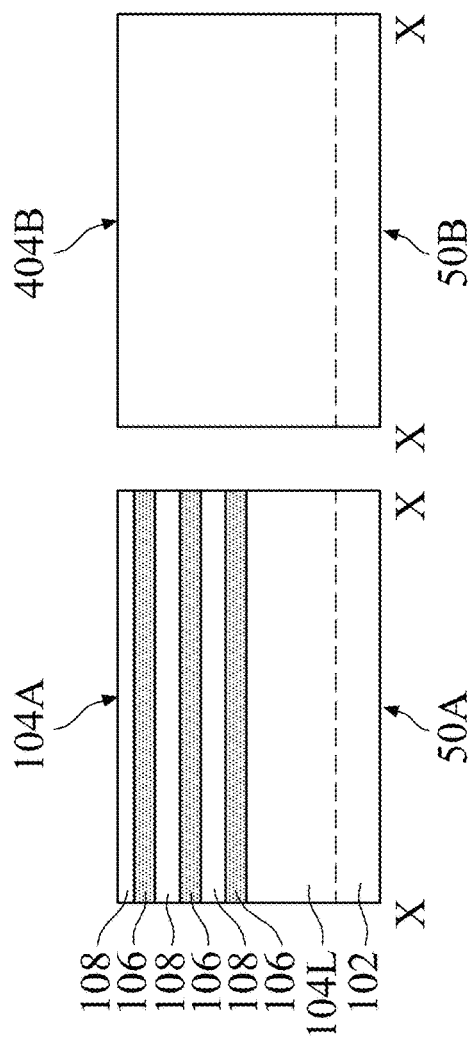

FIGS. 5A-1 through 5A-2 are cross-sectional views illustrating the formation of a semiconductor structure at various intermediate stages, in which the figures ending with "-1" (such as FIG. 5A-1) are cross-sectional views corresponding to cross-section X-X shown in FIG. 1, and the figures ending with "-2" (such as FIG. 5A-2) are cross-sectional views corresponding to cross-section Y-Y shown in FIG. 1, in accordance with some embodiments. The embodiments of FIGS. 5A-1 through 5A-2 are similar to that shown in FIGS. 2A-1 through 2U-2 except that a GAAFET device is formed in the first device region 50A and a FinFET device is formed in the second device region 50B.

FIG. 5A illustrates a cross-sectional view of a semiconductor structure 400 after the formation of a fin structure 104A and a fin structure 404B and an isolation structure 110, in accordance with some embodiments.

The substrate 102 includes a first device region 50A where a fin structure 104A is formed and a second device region 50B where a fin structure 404B is formed, as shown in FIGS. 5A-1 and 5A-2, in accordance with some embodiments. In some embodiments, the first device region 50A is a p-type device region and used for forming p-type semiconductor devices (e.g., p-channel nanostructure transistors). In some embodiments, the second device region 50B is an n-type device region and used for forming n-type semiconductor devices such as n-channel FinFET.

The formation of the fin structure 104A and the fin structure 404B includes recessing an upper portion of the substrate 102 at the first device region 50A using an etching process to form a space in the first device region 50A, and then forming an epitaxial stack over the substrate 102 in the space using an epitaxial growth process, in accordance with some embodiments. The etching process may be an anisotropic etching process such as dry plasma etching, an isotropic etching process such as dry chemical etching, remote plasma etching or wet chemical etching, and/or a combination thereof. The material, composition and the formation method of the epitaxial stack may be similar to or the same as the epitaxial stack described above respect to FIGS. 2A-1 and 2A-2. A planarization process such as CMP or etching back process is performed to remove a portion of the epitaxial stack formed over the substrate 102 until the upper surface of the substrate 102 is exposed, in accordance with some embodiments. After the planarization process, the upper surface of the epitaxial stack and the upper surface of the substrate 102 are substantially coplanar, in accordance with some embodiments. Afterward, the epitaxial stack in the first device region 50A and the upper portion of the substrate 102 in the second device region 50B are patterned into the fin structures 104A in the first device region 50A and the fin structures 404B in the second device region 50B, in accordance with some embodiments. As such, the fin structures 404B and the upper portion of the substrate 102 are made of a single, continuous semiconductor material, in accordance with some embodiments.

An isolation structure 110 is formed to surround a lower fin element 104L of the fin structure 104A and a lower fin element 404L of the fin structure 404B, as shown in FIG. 5A-2, in accordance with some embodiments. The fin structure 404B includes an upper fin element protruding from between the isolation structure 110, in accordance with some embodiments. The material and the formation method of the isolation structure 110 may be similar to or the same as that of the isolation structure 110 as described above with respect to FIGS. 2A-1 and 2A-2.

Figures 1, 2, 5B:
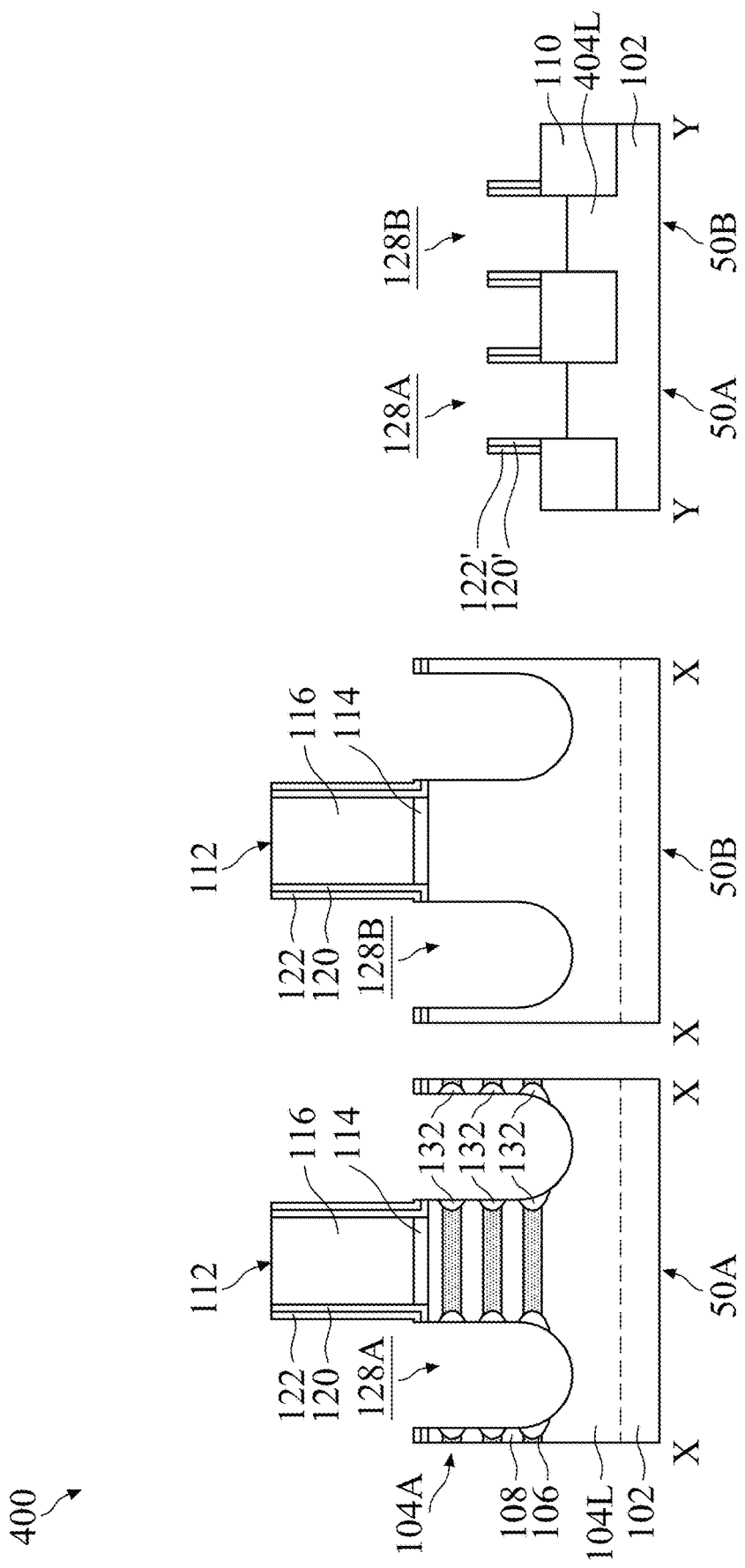

FIGS. 5B-1 and 5B-2 illustrates a cross-sectional view of a semiconductor structure 400 which has been subjected the steps described above respect to FIGS. 2B-1 through 2F-2, in accordance with some embodiments.

A dummy gate structure 112 is formed across and surrounds the channel region of the fin structure 104A and the channel region of the fin structure 404B, and gate spacer layers 120 and 122 are sequentially formed over the semiconductor structure 400, in accordance with some embodiments. One or more etching process is performed to removes horizontal portions of the gate spacer layers 120 and 122 and recess the source/drain regions of the fin structure 104A and the source/drain regions of the fin structure 404B, thereby forming source/drain recesses 128A in the first device region 50A and source/drain recesses 128B in the second device region 50B, in accordance with some embodiments. An etching process is performed on the semiconductor structure 400 to laterally recess, from the source/drain recesses 128A, the first semiconductor layers 106 of the fin structure 104A to form notches 130 (FIG. 2E-1), and inner spacer layers 132 are formed in the notches 130 to abut the first semiconductor layers 106 of the fin structure 104, in accordance with some embodiments.

FIGS. 5C-1 and 5C-2 illustrates a cross-sectional view of a semiconductor structure 400 which has been subjected the steps described above respect to FIGS. 2G-1 through 2M-2, in accordance with some embodiments.

A mask structure including a first dielectric mask layer 134 and a second dielectric mask layer 136 are formed to cover the second device region 50B, in accordance with some embodiments. Source/drain features 146A are formed in the source/drain recesses 128A at first device region 50A of the semiconductor structure 400 using an epitaxial growth process, in accordance with some embodiments.

Figures 1, 2, 5D:
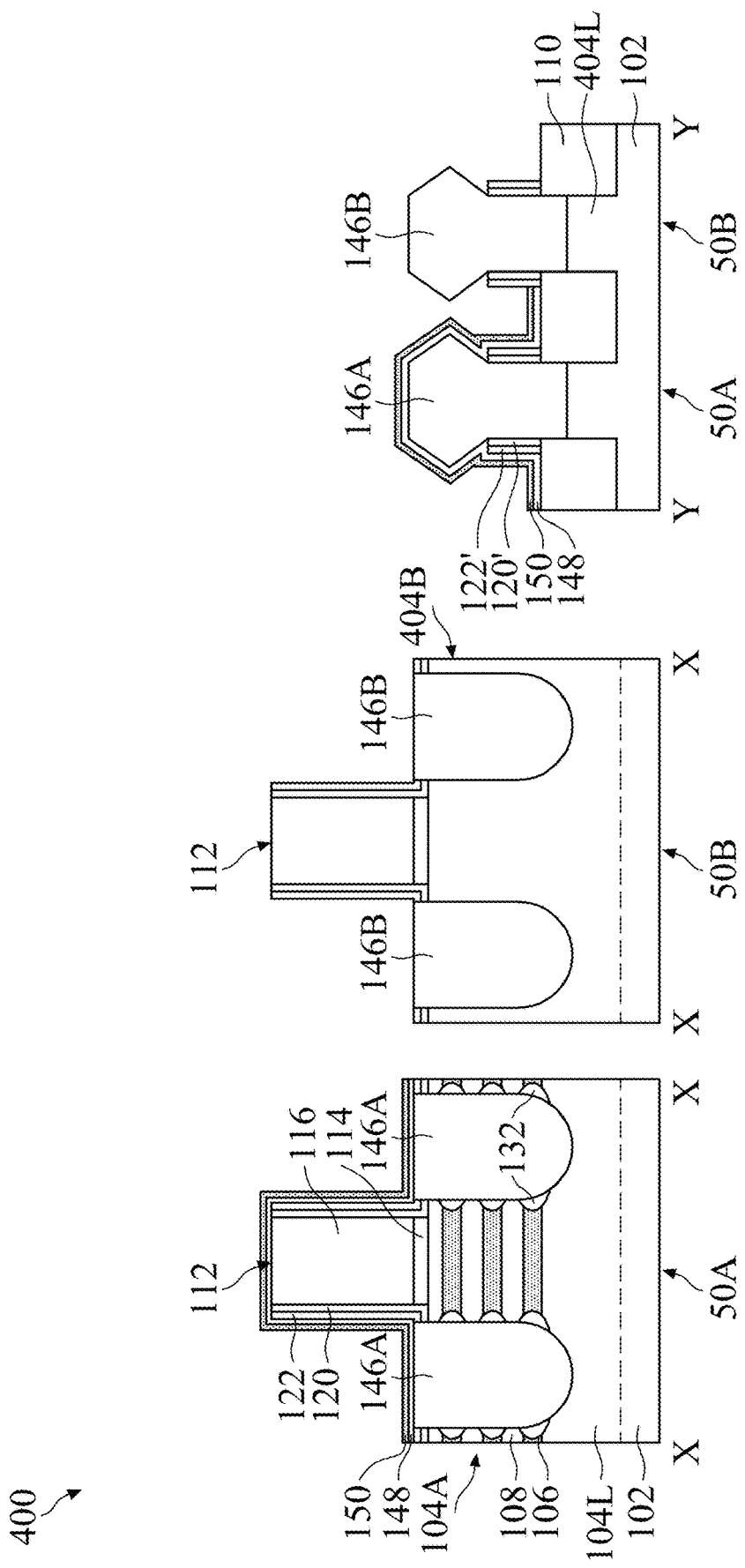

FIGS. 5D-1 and 5D-2 illustrates a cross-sectional view of a semiconductor structure 400 which has been subjected the steps described above respect to FIGS. 2N-1 through 2Q-2, in accordance with some embodiments.

The mask structure for the second device region 50B is removed, in accordance with some embodiments. A mask structure including a fourth dielectric mask layer 148 and a fifth dielectric mask layer 150 are formed to cover the first device region 50A, in accordance with some embodiments. Source/drain features 146B are formed in the source/drain recesses 128B at second device region 50B of the semiconductor structure 400 using an epitaxial growth process, in accordance with some embodiments.

Figures 1, 2, 5E:
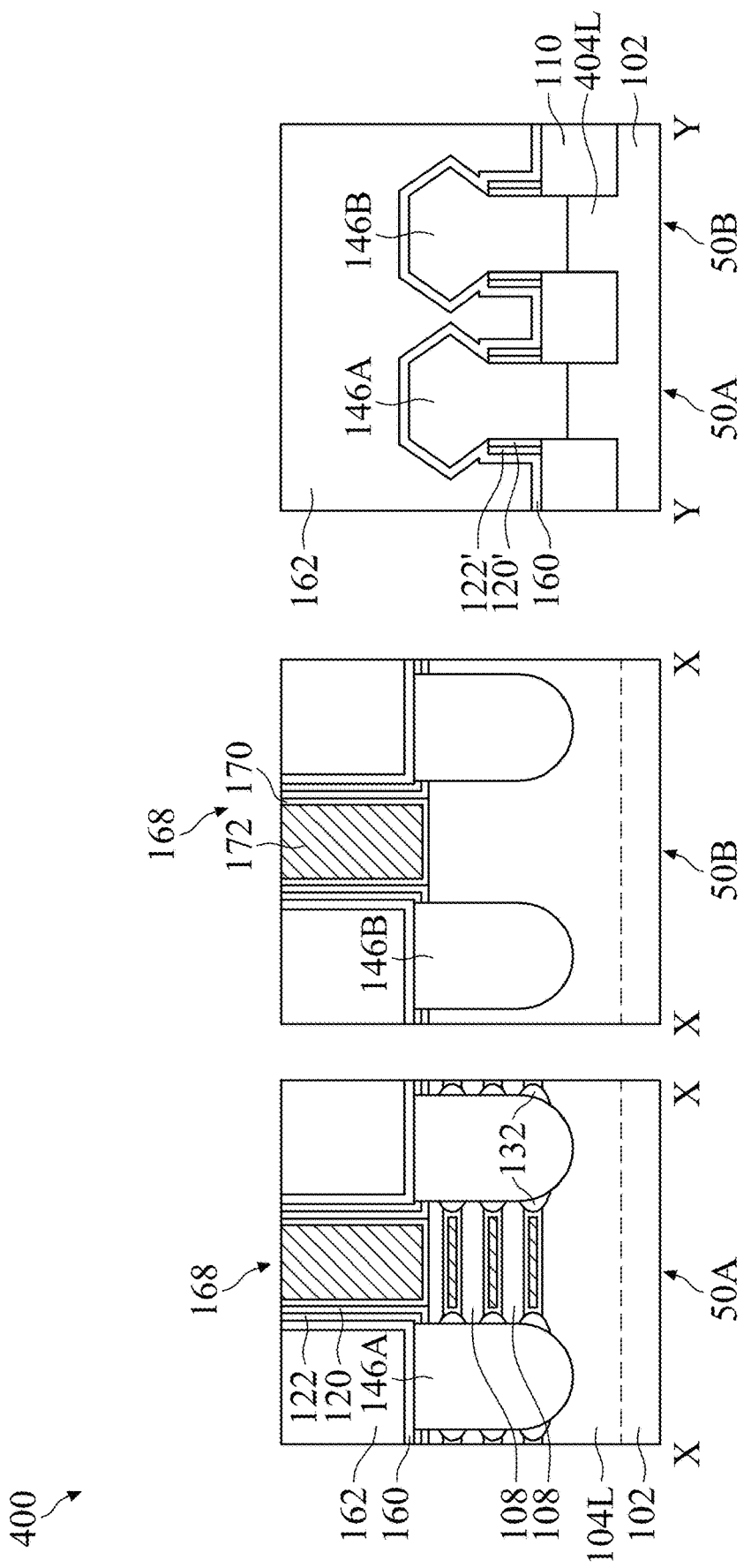

FIGS. 5E-1 and 5E-2 illustrates a cross-sectional view of a semiconductor structure 400 which has been subjected the steps described above respect to FIGS. 2R-1 through 2U-2, in accordance with some embodiments.

The mask structure for the first device region 50A is removed, in accordance with some embodiments. A contact etching stop layer 160 and an interlayer dielectric layer 162 are sequentially formed over the semiconductor structure 400, in accordance with some embodiments. The dummy gate structure 112 is removed using an etching process to form gate trench 164 (FIG. 2T-1), in accordance with some embodiments. The first semiconductor layers 106 of the fin structure 104A are removed using an etching process to form gaps 166 (FIG. 2T-1), in accordance with some embodiments. A final gate structure 168 is formed to wraps around each of nanostructures 108 (the second semiconductor layers 108 of the fin structure 104A) and the channel region of the fin structure 404B, thereby forming a p-channel GAA FET in the first device region 50A and an n-channel FinFET in the second device region 50B, in accordance with some embodiments.

The embodiments provide a hybrid structure including a GAA FET and a FinFET formed over the same semiconductor substrate (or wafer). Integrated circuits including the hybrid structures may have better electrical performance and greater design flexibility. FIGS. 5A-2 through 5E-2 describes the embodiments of the p-channel GAA FET and the n-channel FinFET, but are not limited thereto. The aspect of the present disclosure for forming the source/drain mask structure may also contemplate the embodiments of a p-channel FinFET and an n-channel GAA FET, and/or p-channel FinFET and an n-channel FinFET.

As described above, the aspect of the present disclosure is directed to separately forming source/drain features in different device regions. Embodiments of the method include forming a silicon-containing dielectric mask layer (such as the first dielectric mask layer 134 or the fourth dielectric mask layer 148) and a high-k dielectric mask layer (such as the second dielectric mask layer 136 or the fifth dielectric mask layer 150) over the silicon-containing dielectric mask layer, patterning the dielectric mask layers into a source/drain mask structure that covers a device region and exposes another device region, and then growing source/drain features in the exposed device region. Therefore, the embodiments of the present disclosure use the silicon-containing dielectric mask layer as the bottom layer of the source/drain mask structure, which may provide a good balance between the loss of the low-k spacers (such as the gate spacer layers 120 and 122 and/or the inner spacers 132) and the amount of residue of the source/drain mask structure. Therefore, the process window of patterning the source/drain mask structure is enlarged.

Embodiments for forming a semiconductor structure may be provided. The method may include forming a first fin structure and a second fin structure, forming a first mask structure to cover a second fin structure. The first mask structure includes a first dielectric mask layer and a second dielectric mask layer over the first dielectric mask layer, and the first dielectric mask layer and the second dielectric mask layer are made of different materials. The method may also include forming a first source/drain feature in the first fin structure, and removing the first mask structure to expose the second fin structure. Therefore, a good balance between the loss of low-k spacers and the amount of residue of the source/drain mask structure is provided, thereby enlarging the process window of patterning the source/drain mask structure.

In some embodiments, a method for forming semiconductor structure is provided. The method includes forming a first active region and a second active region, etching the first active region and the second active region to form a first recess and a second recess, respectively, forming the first dielectric layer over the first active region and the second active region, forming a first fill layer over the first dielectric layer to overfill the first recess and the second recess, forming a first dielectric mask over the first fill layer, etching first portions of the first dielectric mask and the first fill layer over the first active region, removing a first portion of the first dielectric layer over the first active region, and forming a first source/drain feature on the first active region.

In some embodiments, a method for forming semiconductor structure is provided. The method includes forming a first dielectric layer over a first active region and a second active region, forming a second dielectric layer over the first dielectric layer, forming a patterned dielectric mask on the second dielectric layer over the second active region, removing a first portion of the second dielectric layer over the first active region, removing the patterned dielectric mask while removing the first portion of the second dielectric layer over the first active region, removing a first portion of the first dielectric layer over the first active region, and growing a first epitaxial material on the first active region.

In some embodiments, a method for forming semiconductor structure is provided. The method includes forming a first active region and a second active region. Each of the first active region and the second active region includes first semiconductor layers and second semiconductor layers alternatingly stacked. The method further includes etching the first active region and the second active region to form a first recess and a second recess, respectively, laterally recessing the first active region and the second active region to form notches, forming inner spacers in the notches, forming a first dielectric layer in the first recess and the second recess, forming a second dielectric layer over the first dielectric layer, patterning the first dielectric layer and the second dielectric layer to form a first source/drain mask on the second active region, and forming a first source/drain feature on the first active region. The first dielectric layer is in direct contact with the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first active region and a second active region;
    etching the first active region and the second active region to form a first recess and a second recess, respectively;
    forming the first dielectric layer over the first active region and the second active region;
    forming a first fill layer over the first dielectric layer to overfill the first recess and the second recess;
    forming a first dielectric mask over the first fill layer;
    etching first portions of the first dielectric mask and the first fill layer over the first active region;
    removing a first portion of the first dielectric layer over the first active region; and
    forming a first source/drain feature on the first active region.

2. The method for forming the semiconductor structure as claimed in claim 1, further comprising:
    removing a second portion of the first dielectric mask over the second active region while removing the first portion of the first dielectric layer over the first active region.

3. The method for forming the semiconductor structure as claimed in claim 1, further comprising:
    removing a second portion of the first fill layer over the second active region to expose a second portion of the first dielectric layer over the second active region before forming the first source/drain feature.

4. The method for forming the semiconductor structure as claimed in claim 1, further comprising:
    forming the second dielectric layer over the first active region and the second active region;
    forming a second fill layer over the first dielectric layer to overfill the second recess;

forming a second dielectric mask over the second fill layer;
etching first portions of the second dielectric mask and the second fill layer over the second active region;
removing a first portion of the second dielectric layer over the second active region; and
forming a second source/drain feature on the second active region.

5. The method for forming the semiconductor structure as claimed in claim 1, further comprising:
forming a second dielectric layer over the first active region and the second active region, wherein the first dielectric layer is formed on the second dielectric layer; and
removing a first portion of the second dielectric layer over the first active region before forming the first source/drain feature.

6. The method for forming the semiconductor structure as claimed in claim 5, wherein the first dielectric layer is made of an oxide of amphoteric metal, and the second dielectric layer is made of silicon oxide.

7. The method for forming the semiconductor structure as claimed in claim 5, wherein:
etching the first portion of the first dielectric layer comprises a wet etching process using an alkaline solution, and
etching the first portion of the second dielectric layer comprises a wet etching process using an acidic solution.

8. The method for forming the semiconductor structure as claimed in claim 1, wherein each of the first active region and the second active region includes first semiconductor layers and second semiconductor layers alternatingly stacked.

9. The method for forming the semiconductor structure as claimed in claim 8, further comprising:
laterally recessing the first active region and the second active region to form notches; and
forming inner spacers in the notches, wherein the first dielectric layer is formed on and in direct contact with the inner spacers.

10. A method for forming a semiconductor structure, comprising:
forming a first dielectric layer over a first active region and a second active region;
forming a second dielectric layer over the first dielectric layer;
forming a patterned dielectric mask on the second dielectric layer over the second active region;
removing a first portion of the second dielectric layer over the first active region;
removing the patterned dielectric mask while removing the first portion of the second dielectric layer over the first active region;
removing a first portion of the first dielectric layer over the first active region; and
growing a first epitaxial material on the first active region.

11. The method for forming the semiconductor structure as claimed in claim 10, wherein the first dielectric layer is made of silicon oxide, and the second dielectric layer is made of zinc oxide, aluminum oxide, tin oxide, lead oxide, beryllium oxide, or chromium oxide.

12. The method for forming the semiconductor structure as claimed in claim 10, further comprising:
removing second portions of the first dielectric layer and the second dielectric layer over the second active region; and
growing a second epitaxial material on the second active region.

13. The method for forming the semiconductor structure as claimed in claim 12, wherein the first epitaxial material is doped with a p-type dopant, and the second epitaxial material is doped with an n-type dopant.

14. The method for forming the semiconductor structure as claimed in claim 10, further comprising:
alternatingly stacking first semiconductor layers and second semiconductor layers over a substrate; and
patterning the first semiconductor layers and the second semiconductor layers into the first active region and the second active region.

15. The method for forming the semiconductor structure as claimed in claim 10, further comprising:
forming an isolation structure to surround the first active region and the second active region, wherein after removing a first portion of the first dielectric layer, second portions of the first dielectric layer and the second dielectric layer over the second active region terminate on a top surface of a portion of the isolation structure between the first active region and the second active region.

16. A method for forming a semiconductor structure, comprising:
forming a first active region and a second active region, wherein each of the first active region and the second active region includes first semiconductor layers and second semiconductor layers alternatingly stacked;
etching the first active region and the second active region to form a first recess and a second recess, respectively;
laterally recessing the first active region and the second active region to form notches;
forming inner spacers in the notches;
forming a first dielectric layer in the first recess and the second recess, wherein the first dielectric layer is in direct contact with the inner spacers;
forming a second dielectric layer over the first dielectric layer;
patterning the first dielectric layer and the second dielectric layer to form a first source/drain mask on the second active region; and
forming a first source/drain feature on the first active region.

17. The method for forming the semiconductor structure as claimed in claim 16, wherein patterning the first dielectric layer and the second dielectric layer comprises:
forming a fill layer to overfill the first recess and the second recess;
forming a patterned hard mask on the fill layer; and
etching the fill layer, the second dielectric layer and the first dielectric layer.

18. The method for forming the semiconductor structure as claimed in claim 17, wherein the patterned hard mask is removed during the second dielectric layer is etched.

19. The method for forming the semiconductor structure as claimed in claim 17, wherein a portion of the first dielectric layer remains in the notches after etching the fill layer, the second dielectric layer and the first dielectric layer.

20. The method for forming the semiconductor structure as claimed in claim 16, further comprising:
removing the first source/drain mask;
forming a second source/drain feature on the second active region;
removing the first semiconductor layers; and forming a gate stack to surround the second semiconductor layers.

\* \* \* \* \*